(12) United States Patent
Kim et al.

(10) Patent No.: US 11,963,410 B2
(45) Date of Patent: Apr. 16, 2024

(54) DISPLAY DEVICE HAVING CONDUCTIVE PATTERNS WITH REDUCED DISPLAY ELEMENT OVERLAP

(71) Applicant: SAMSUNG DISPLAY CO., LTD., Yongin-si (KR)

(72) Inventors: Yang Wan Kim, Yongin-si (KR); Byung Sun Kim, Yongin-si (KR); Jae Yong Lee, Yongin-si (KR); Chung Yi, Yongin-si (KR); Hyung Jun Park, Yongin-si (KR); Su Jin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/806,727

(22) Filed: Jun. 13, 2022

(65) Prior Publication Data
US 2022/0310765 A1    Sep. 29, 2022

Related U.S. Application Data

(63) Continuation of application No. 16/909,594, filed on Jun. 23, 2020, now Pat. No. 11,362,166, which is a (Continued)

(30) Foreign Application Priority Data

Sep. 13, 2016    (KR) .......................... 10-2016-0118343

(51) Int. Cl.
*H01L 29/08*    (2006.01)
*H10K 59/121*    (2023.01)
(Continued)

(52) U.S. Cl.
CPC ....... *H10K 59/131* (2023.02); *H10K 59/1216* (2023.02); *H10K 59/122* (2023.02)

(58) Field of Classification Search
CPC . H10K 59/131; H10K 59/122; H10K 59/1216
(Continued)

(56) References Cited

U.S. PATENT DOCUMENTS 8,203,261 B2    6/2012    Tanaka et al.
9,165,993 B2    10/2015    Kim
(Continued)

FOREIGN PATENT DOCUMENTS

CN    103972271    8/2014
JP    2002299051    10/2002
(Continued)

OTHER PUBLICATIONS

Notice of Allowance for U.S. Appl. No. 17/811,298.
(Continued)

*Primary Examiner* — Phuc T Dang
(74) *Attorney, Agent, or Firm* — F. CHAU & ASSOCIATES, LLC

(57) ABSTRACT

A display device includes a substrate including a pixel region and a peripheral region. A plurality of pixels is disposed in the pixel region of the substrate. Each of the plurality of pixels includes a light emitting element. Data lines and scan lines are connected to each of the plurality of pixels. A power line is configured to supply power to the plurality of pixels. The power line includes a plurality of first conductive lines and a plurality of second conductive lines intersecting the plurality of first conductive lines. The plurality of second conductive lines is arranged in a region between adjacent light emitting elements of the plurality of pixels. At least some of the plurality of second conductive lines extend in a direction oblique to a direction of extension of the data lines or the scan lines.

10 Claims, 16 Drawing Sheets

Related U.S. Application Data continuation of application No. 15/469,139, filed on Mar. 24, 2017, now Pat. No. 10,943,967.

(51) Int. Cl.
  H10K 59/122 (2023.01)
  H10K 59/131 (2023.01)

(58) Field of Classification Search
  USPC .......................................................... 257/40
  See application file for complete search history.

(56) References Cited

U.S. PATENT DOCUMENTS

| | | | |
|---|---|---|---|
| 9,208,710 | B2 | 12/2015 | Fukumoto et al. |
| 9,300,771 | B2 | 3/2016 | Osame et al. |
| 9,601,053 | B2 | 3/2017 | Xi et al. |
| 10,115,781 | B2 | 10/2018 | Huang et al. |
| 10,943,967 | B2 | 3/2021 | Kim et al. |
| 2005/0161740 | A1 | 7/2005 | Park et al. |
| 2008/0218062 | A1* | 9/2008 | Kim .................... H10K 59/131 313/504 |
| 2009/0127545 | A1 | 5/2009 | Park et al. |
| 2009/0261720 | A1 | 10/2009 | Shinto |
| 2010/0276704 | A1 | 11/2010 | Park et al. |
| 2012/0126258 | A1 | 5/2012 | Lee et al. |
| 2014/0077176 | A1* | 3/2014 | Lee .................... H10K 50/00 257/40 |
| 2014/0118232 | A1 | 5/2014 | Kim |
| 2014/0124745 | A1 | 7/2014 | Walsh |
| 2014/0239270 | A1 | 8/2014 | Ko et al. |
| 2014/0299843 | A1 | 10/2014 | Kim |
| 2014/0354141 | A1 | 12/2014 | Lee et al. |
| 2014/0361273 | A1 | 12/2014 | Nozawa |
| 2015/0279271 | A1 | 10/2015 | Xi et al. |
| 2016/0027862 | A1 | 1/2016 | Lee et al. |
| 2016/0087021 | A1 | 3/2016 | Sato |
| 2016/0099299 | A1 | 4/2016 | Chung et al. |
| 2016/0118452 | A1 | 4/2016 | Pyon |
| 2016/0126303 | A1 | 5/2016 | Kwon et al. |
| 2016/0141558 | A1 | 5/2016 | Cha et al. |
| 2016/0210896 | A1 | 7/2016 | Gil |
| 2016/0293889 | A1 | 10/2016 | Nakamura |
| 2018/0072673 | A1 | 3/2018 | Kim et al. |
| 2020/0321424 | A1 | 10/2020 | Kim et al. |

FOREIGN PATENT DOCUMENTS

| | | |
|---|---|---|
| JP | 2007214335 | 8/2007 |
| KR | 10-2014-0120734 | 10/2014 |
| TW | 201619430 | 5/2015 |

OTHER PUBLICATIONS

Extended European Search Report dated May 29, 2018 For European Patent Application No. 17190613.4.

Notice of Allowance dated Oct. 29, 2020 or U.S. Appl. No. 15/469,139.

* cited by examiner

DISPLAY DEVICE HAVING CONDUCTIVE PATTERNS WITH REDUCED DISPLAY ELEMENT OVERLAP

CROSS-REFERENCE TO RELATED APPLICATION

This application is a Continuation of U.S. patent application Ser. No. 16/909,594, filed on Jun. 23, 2020 (issued on Jun. 14, 2022 as U.S. Pat. No. 11,362,166), which is a Continuation of U.S. patent application Ser. No. 15/469,139, filed on Mar. 24, 2017 (issued on Mar. 9, 2021 as U.S. Pat. No. 10,943,967), which claims priority to and the benefit of Korean Patent Application No. 10-2016-0118343, filed on Sep. 13, 2016, in the Korean Intellectual Property Office, the entire contents of which are incorporated by reference herein in their entirety.

TECHNICAL FIELD

An embodiment of the present invention relates to a display device, and more specifically, to a display device having conductive patterns with reduced display element overlap.

DISCUSSION OF THE RELATED ART

A display device includes a plurality of pixels each including a display element. In each of the pixels, wiring lines, and at least one transistor connected to the wiring lines to drive the display device, are arranged.

The transistor is electrically connected to the display element and the transistor may drive the display element by using signals applied from the wiring lines.

At least some of these wiring lines may overlap the display elements that are responsible for displaying an image. Even though the wiring lines may be disposed behind the display element, wiring lines that are disposed behind the display element may form step difference under the display element. The step difference causes surface non-uniformity of the display element. The surface non-uniformity of the display element may generate white angle dependency (WAD) in accordance with a view angle of the display device.

SUMMARY

A display device includes a substrate including a pixel region and a peripheral region. A plurality of pixels is disposed in the pixel region of the substrate. Each of the plurality of pixels includes a light emitting element. Data lines and scan lines are connected to each of the plurality of pixels. A power line is configured to supply power to the plurality of pixels. The power line includes a plurality of first conductive lines and a plurality of second conductive lines intersecting the plurality of first conductive lines. The plurality of second conductive lines is arranged in a region between adjacent light emitting elements of the plurality of pixels. At least some of the plurality of second conductive lines extend in a direction oblique to a direction of extension of the data lines or the scan lines.

A display device includes a substrate having a pixel region and a peripheral region. A plurality of pixels is disposed in the pixel region of the substrate and each of the plurality of pixels includes at least one transistor and a light emitting element connected to the transistor. Data lines and scan lines are connected to the plurality of pixels. A power line is configured to supply power to the plurality of pixels. The transistor includes an active pattern disposed on the substrate, and a source electrode and a drain electrode connected to the active pattern. The gate electrode is disposed on the active pattern with a gate insulating layer interposed therebetween. An interlayer insulating layer covers the gate electrode and includes a first interlayer insulating layer, a second interlayer insulating layer, and a third interlayer insulating layer that are sequentially laminated. The power line includes a first conductive layer extending parallel to the data lines and disposed on the second interlayer insulating layer and a second conductive layer disposed on the third interlayer insulating layer and connected to the first conductive layer through a contact hole that passes through the third interlayer insulating layer. The second conductive layer includes first conductive lines extending in a first direction and second conductive lines intersecting the first conductive lines, arranged in a region between adjacent light emitting elements of the plurality of pixels. At least some of the light emitting elements of the plurality of pixels are extend in a direction oblique to a direction of extension of the data lines or the scan lines.

A display device includes a substrate having a pixel region and a peripheral region. A plurality of pixels is disposed in the pixel region of the substrate and each of the plurality of pixels includes a light emitting element. Data lines and scan lines are connected to the plurality of pixels. A first power line is electrically connected to a first electrode of the light emitting element of the plurality of pixels. A second power line is connected to a second electrode of the light emitting element of the plurality of pixels. The first power line includes first conductive lines extending in one direction and second conductive lines crossing the first conductive lines, and disposed in a region between adjacent light emitting elements of the plurality of pixels. At least one of the second conductive lines extends in a direction oblique to a direction of extension of the data lines or the scan lines.

BRIEF DESCRIPTION OF THE DRAWINGS

Example embodiments of the present invention will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout the application and the figures.

DETAILED DESCRIPTION

The present invention may be modified variably and may have various embodiments, particular examples of which will be illustrated in drawings and described in detail. However, it is to be understood that the present invention is not limited to a specific disclosed form, but includes all modifications, equivalents, and substitutions without departing from the scope and spirit of the present invention.

In describing drawings, like numbers may refer to like elements. In the accompanying drawings, dimensions of structures may be exaggerated to clarify the present invention. While terms such as "first" and "second," etc., may be used to describe various components, such components should not be understood as being limited to the above terms. The above terms are used to distinguish one component from another.

It will be understood that when an element such as a layer, film, region, or substrate is referred to as being "on" another element, it can be directly on the other element or intervening elements may also be present.

Hereinafter, embodiments of the present invention will be described in more detail with reference to the accompanying drawings.

Figure 1:
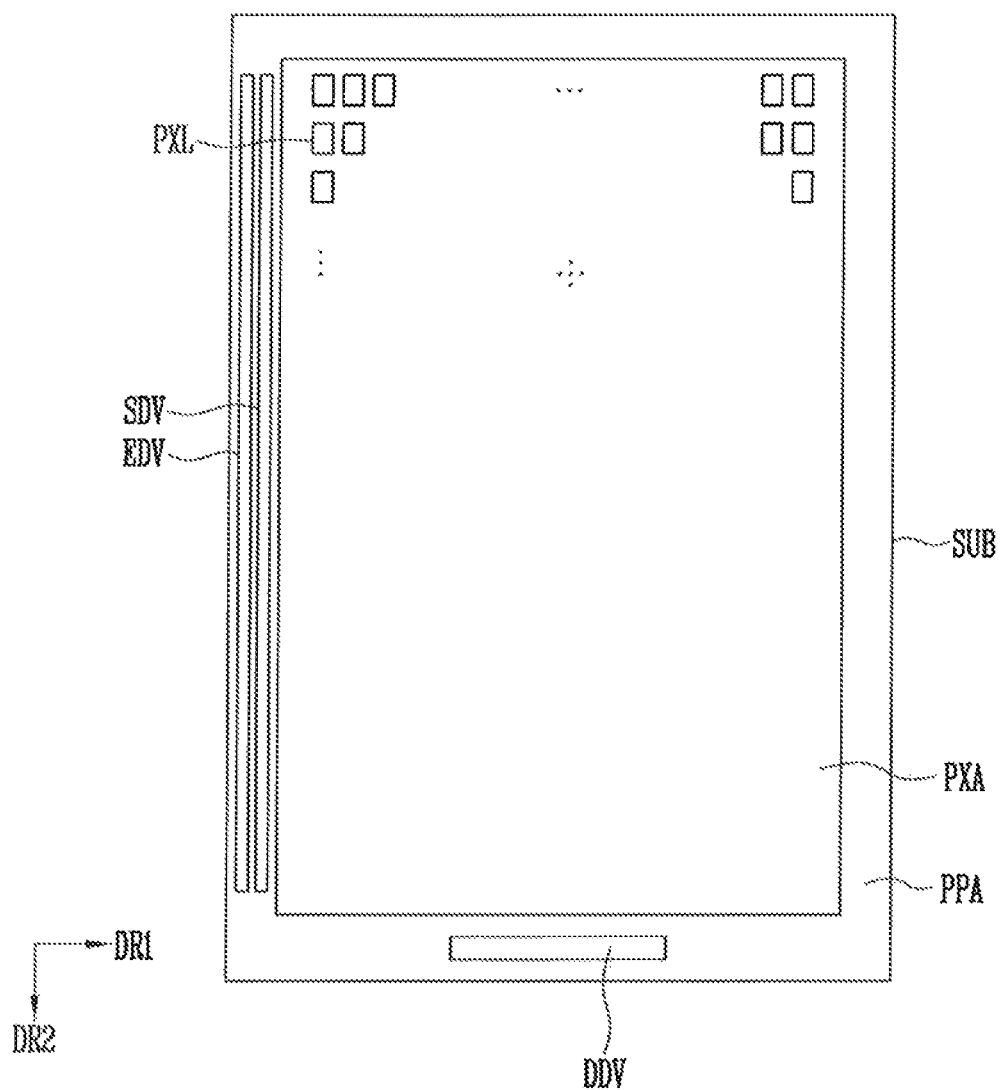
FIG. 1 is a plan view illustrating a display device according to an exemplary embodiment of the present invention.

FIG. 1 is a plan view illustrating a display device according to an exemplary embodiment of the present invention.

Referring to FIG. 1, the display device may include a substrate SUB, pixels PXL disposed on the substrate SUB, a driver disposed on the substrate SUB to drive the pixels PXL, and a wiring line unit for connecting the pixels PXL and the driver.

The substrate SUB may include a pixel region PXA and a peripheral region PPA. In the pixel region PXA, the pixels PXL that display an image are provided. The pixels PXL will be described later. In the peripheral region PPA, the pixels PXL are not disposed. Therefore, the image is not displayed on the peripheral region PPA. In the peripheral region PPA, the driver for driving the pixels PXL and a part of a wiring line for connecting the pixels PXL and the driver may be disposed. The peripheral region PPA may correspond to a bezel in the final display device. A width of the bezel may be determined in accordance with a width of the peripheral region PPA.

The pixel region PXA may have various shapes. For example, the pixel region PXA may be a closed polygon, such as a square or rectangle, a circle or an ellipse, a semi-circle, or a semi-ellipse. The pixel region PXA may be of any closed shape having sides that are straight and/or curved sides. When the pixel region PXA includes a plurality of regions, each of the regions may also be a closed polygon, such as a square or rectangle, a circle or an ellipse, a semi-circle, or a semi-ellipse or any other closed shape including straight and/or curved sides. In addition, areas of the plurality of regions may be equal to each other or different from each other.

According to this approach, the pixel region PXA is illustrated as being a square region including straight sides.

The peripheral region PPA may be disposed on at least one side of the pixel region PXA. According to an exemplary embodiment of the present invention, the peripheral region PPA may surround the pixel region PXA. According to an exemplary embodiment of the present invention, the peripheral region PPA may include horizontal units that extend in a width direction and vertical units that extend in a length direction. There may be two vertical units in the peripheral region PPA that are separate from each other in the width direction.

The pixels PXL may be disposed in the pixel region PXA formed on the substrate SUB. Each of the plurality of pixels PXL may be a minimum unit that displays an image. The pixels PXL may include organic light emitting diodes (OLED) that emit white light components and/or color light components. Each of the pixels PXL may emit red light, green light, or blue light. However, the present invention is not limited thereto. For example, the pixel PXL may emit cyan light, magenta light, yellow light, or white light.

The plurality of pixels PXL may be arranged in a matrix having rows that extend in a first direction DR1 and columns that extend in a second direction DR2 that crosses the first direction. However, arrangement of the pixels PXL is not limited thereto. The pixels PXL may be arranged in various forms. For example, some of the pixels PXL may be arranged so that the first direction DR1 is a row direction. However, others of the pixels PXL may be arranged so that a direction that is not the first direction DR1, for example, the row direction may be a direction oblique to the first direction DR1 and the column direction may be a direction that intersects the row direction. Here, the column direction may be oblique to both the first direction DR1 and the second direction DR2.

The driver provides signals to the pixels PXL through the wiring line unit to drive the pixels PXL. In FIG. 1, for convenience of explanation, the wiring line unit is not shown. The wiring line unit will be described later.

The driver may include a scan driver SDV for providing scan signals to the pixels PXL through scan lines, an emission driver EDV for providing emission control signals to the pixels PXL through emission control lines, a data driver DDV for providing data signals to the pixels PXL through data lines, and a timing controller. The timing controller may control the scan driver SDV, the emission driver EDV, and the data driver DDV.

The scan driver SDV may be arranged in the vertical unit of the peripheral region PPA. Since the vertical units of the peripheral region PPA form a pair separated from each other in the width direction of the pixel region PXA, the scan driver SDV may be arranged in at least one of the vertical units of the peripheral region PPA. The scan driver SDV may extend in the length direction of the peripheral region PPA.

According to an exemplary embodiment of the present invention, the scan driver SDV may be directly mounted on the substrate SUB. When the scan driver SDV is directly mounted on the substrate SUB, the scan driver SDV may be formed in a process of forming the pixels PXL. However, a position of the scan driver SDV and a method of forming the scan driver SDV are not limited thereto. The scan driver SDV may be formed in a separate chip and may be disposed on the substrate SUB in a chip on glass (COG) method. In addition, the scan driver SDV may be mounted on a printed circuit board (PCB) to be connected to the substrate SUB through a connection member.

The emission driver EDV may also be arranged in the vertical unit of the peripheral region PPA like the scan driver SDV. The emission driver EDV may be arranged on at least one side of the vertical unit of the peripheral region PPA. The emission driver EDV may extend in the length direction of the peripheral region PPA.

According to an exemplary embodiment of the present invention, the emission driver EDV may be directly mounted on the substrate SUB. When the emission driver EDV is directly mounted on the substrate SUB, the emission driver EDV may be formed during a process of forming the pixels PXL. However, a position of the emission driver EDV and a method of forming the emission driver EDV are not limited thereto. The emission driver EDV may be formed in a separate chip and may be disposed on the substrate SUB in the COG method. In addition, the emission driver EDV may be mounted on the PCB to be connected to the substrate SUB through the connection member.

According to an exemplary embodiment of the present invention, the scan driver SDV and the emission driver EDV are illustrated as being adjacent to each other and formed at one side of the pair of vertical units of the peripheral region PPA. However, the present invention is not limited thereto. The scan driver SDV and the emission driver EDV may be arranged according to various configurations. For example, the scan driver SDV may be disposed at one side of the vertical units of the peripheral region PPA and the emission driver EDV may be disposed at the other side of the vertical units of the peripheral region PPA. Alternatively, the scan driver SDV may be disposed at both the vertical units of the peripheral region PPA and the emission driver EDV may be disposed at only one side of the vertical units of the peripheral region PPA.

The data driver DDV may be arranged in the peripheral region PPA. For example, the data driver DDV may be arranged in the horizontal unit of the peripheral region PPA. The data driver DDV may extend in the width direction of the peripheral region PPA.

According to an exemplary embodiment of the present invention, positions/a position of the scan driver SDV, the emission driver EDV, and/or the data driver DDV may be changed as desired.

The timing controller may be connected to the scan driver SDV, the emission driver EDV, and the data driver DDV through wiring lines by various methods. A position of the timing controller is not limited to the configuration shown. For example, the timing controller is mounted on the PCB and may be connected to the scan driver SDV, the emission driver EDV, and the data driver DDV through the PCB and the PCB may be arranged in various positions, for example, at one side of the substrate SUB or on a rear surface of the substrate SUB.

Figure 2:
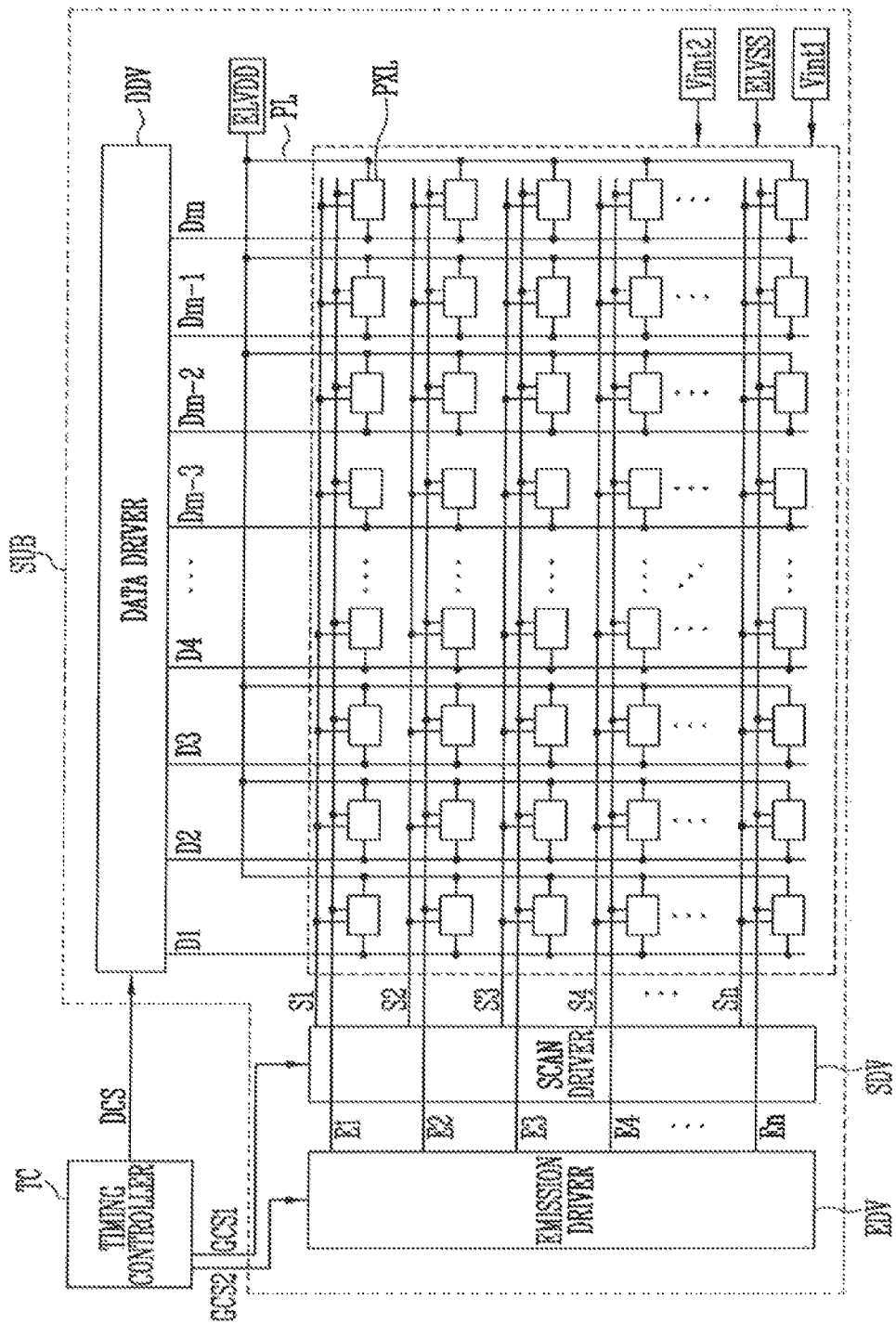
FIG. 2 is a block diagram illustrating pixels and a driver according to an exemplary embodiment of the present invention.

FIG. 2 is a block diagram illustrating pixels and a driver according to an exemplary embodiment of the present invention.

Referring to FIG. 2, the display device may include the pixels PXL, the driver, and the wiring line unit.

The plurality of pixels PXL may be disposed. The driver may include the scan driver SDV, the emission driver EDV, the data driver DDV, and the timing controller TC. In FIG. 2, positions of the scan driver SDV, the emission driver EDV, the data driver DDV, and the timing controller TC are set in an exemplary fashion. The display device, according to exemplary embodiments of the present invention, may alternatively be implemented in other manners. For example, the scan driver SDV, the emission driver EDV, the data driver DDV, and the timing controller TC may be arranged in other positions in the display device.

The wiring line unit provides signals from the driver to the pixels PXL and may include scan lines, data lines, emission control lines, a power line PL, and a first initializing power line Vint1. The scan lines include a plurality of scan lines S1 through Sn and the emission control lines may include a plurality of emission control lines E1 through En. The data lines D1 through Dm and the power line PL may be connected to the pixels PXL.

The pixels PXL may be arranged in the pixel region PXA. The pixels PXL may be connected to the scan lines S1 through Sn, the emission control lines E1 through En, the data lines D1 through Dm, and the power line PL. The pixels PXL may receive the data signals from the data lines D1 through Dm when the scan signals are supplied from the scan lines S1 through Sn.

In addition, the pixels PXL may receive a first power ELVDD, a second power ELVSS, and an initializing power Vint from an external source. Here, the first power ELVDD may be applied through the power line PL.

Each of the pixels PXL may include a driving transistor and an OLED. In response to the data signal, the driving transistor may control an amount of current that flows from the first power ELVDD to the second power ELVSS via the OLED. For example, before the data signal is supplied, a gate electrode of the driving transistor may be initialized by a voltage of the initializing power Vint. For this purpose, the initializing power Vint may be set to have a lower voltage than the data signal.

The scan driver SDV may supply the scan signals to the scan lines S1 through Sn in response to a first gate control signal GCS1 supplied from the timing controller TC. For example, the scan driver SDV may sequentially supply the scan signals to the scan lines S1 through Sn. When the scan signals are sequentially supplied to the scan lines S1 through Sn, the pixels PXL may be sequentially selected in units of horizontal lines.

The emission driver EDV may supply the emission control signals to the emission control lines E1 through En in response to a second gate control signal GCS2 supplied from the timing controller TC. For example, the emission driver EDV may sequentially supply the emission control signals to the emission control lines E1 through En.

Here, the emission control signals may be set to have larger widths than the scan signals. For example, the emission control signal supplied to an i-th (where I is a positive integer) emission control line Ei may overlap the scan signal supplied to an (i−1)th scan line Si−1 and the scan signal supplied to an i-th scan line Si in at least a partial period.

In addition, the emission control signals are set to have gate off voltages (for example, relatively high voltages) so that transistors included in the pixels PXL may be turned off. The scan signals may be set to have gate on voltages (for example, relatively low voltages) so that the transistors included in the pixels PXL may be turned on.

The data driver DDV may supply the data signals to the data lines D1 through Dm in response to a data control signal DCS. The data signals supplied to the data lines D1 through Dm may be supplied to the pixels PXL selected by the scan signals.

The timing controller TC supplies the gate control signals GCS1 and GCS2 generated based on timing signals supplied from the outside to the scan driver SDV and the emission driver EDV and may supply the data control signal DCS to the data driver DDV.

A start pulse and clock signals may be included in each of the gate control signals GCS1 and GCS2. The start pulse may control timing of a first scan signal or a first emission control signal. The clock signals may be used for shifting the start pulse.

A source start pulse and clock signals may be included in the data control signal DCS. The source start pulse may control a sampling start point of time of data. The clock signals may be used for controlling a sampling operation.

Figure 3:
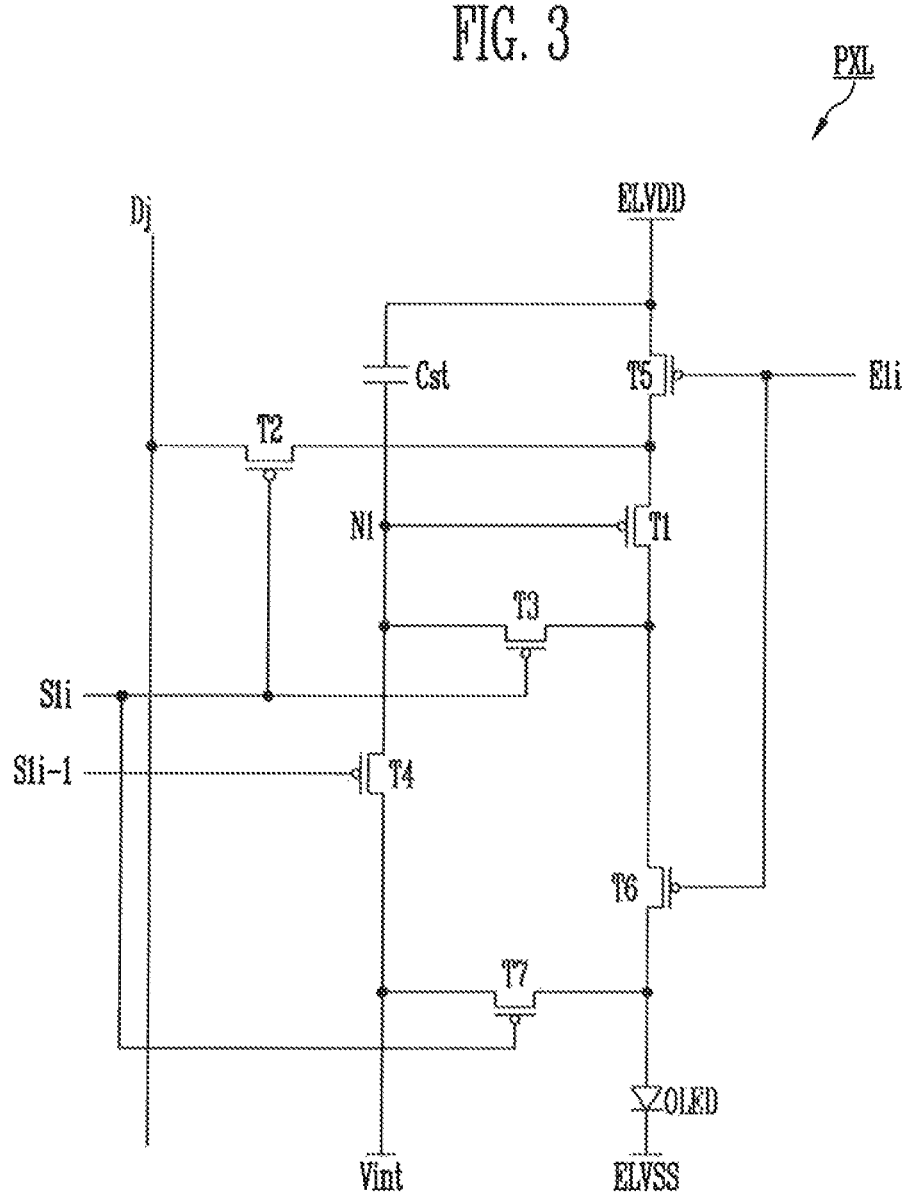
FIG. 3 is an equivalent circuit diagram illustrating an embodiment of the pixel of FIG. 2.

FIG. 3 is an equivalent circuit diagram illustrating an exemplary embodiment of the pixel of FIG. 2. In FIG. 3, for convenience sake, a pixel connected to a j-th data line Dj and an i-th first scan line Si is illustrated.

Referring to FIGS. 2 and 3, the pixel PXL may include an OLED "OLED", a first transistor T1, a second transistor T2, a third transistor T3, a fourth transistor T4, a fifth transistor T5, a sixth transistor T6, a seventh transistor T7, and a storage capacitor Cst.

An anode of the OLED "OLED" is connected to the first transistor Ti via the sixth transistor T6 and a cathode thereof may be connected to the second power ELVSS. The OLED "OLED" may generate light with predetermined brightness in response to an amount of current supplied from the first transistor T1.

The first power ELVDD may be set to have a higher voltage than the second power ELVSS so that current may flow to the OLED "OLED".

The seventh transistor T7 may be connected between the initializing power source Vint and the anode of the OLED "OLED". A gate electrode of the seventh transistor T7 may be connected to the i-th first scan line Si. The seventh transistor T7 is turned on when a scan signal is supplied to the i-th first scan line Si and may supply the voltage of the initializing power Vint to the anode of the OLED "OLED". Here, the initializing power Vint may be set to have a lower voltage than a data signal.

The sixth transistor T6 may be connected between the first transistor T1 and the OLED "OLED". A gate electrode of the sixth transistor T6 may be connected to an i-th emission control line Ei. The sixth transistor T6 is turned off when the emission control signal is supplied to the i-th emission control line Ei and may be turned on in the other case.

The fifth transistor T5 may be connected between the first power ELVDD and the first transistor T1. A gate electrode of the fifth transistor T5 may be connected to the i-th emission control line Ei. The fifth transistor T5 is turned off when the emission control signal is supplied to the i-th emission control line Ei and may be turned on in the other case.

A first electrode of the first transistor T1 (e.g. the driving transistor) is connected to the first power ELVDD via the fifth transistor T5 and a second electrode thereof may be connected to the anode of the OLED "OLED" via the sixth transistor T6. A gate electrode of the first transistor T1 may be connected to a first node N1. The first transistor T1 may control an amount of current that flows from the first power ELVDD to the second power ELVSS via the OLED "OLED" in response to a voltage of the first node N1. For example, the first power ELVDD may be electrically connected to the anode of the OLED "OLED" through the first transistor T1.

The third transistor T3 may be connected between the second electrode of the first transistor T1 and the first node N1. A gate electrode of the third transistor T3 may be connected to the i-th first scan line Si. The third transistor T3 is turned on when the scan signal is supplied to the i-th first scan line Si and may electrically connect the second electrode of the first transistor T1 and the first node N1. Therefore, when the third transistor T3 is turned on, the first transistor T1 may be diode-connected.

The fourth transistor T4 may be connected between the first node N1 and the initializing power Vint. A gate electrode of the fourth transistor T4 may be connected to an (i−1)th first scan line Si−1. The fourth transistor T4 is turned on when a scan signal is supplied to the (i−1)th first scan line Si−1 and may supply the voltage of the initializing power Vint to the first node N1.

The second transistor T2 may be connected between the jth data line Dj and the first electrode of the first transistor T1. A gate electrode of the second transistor T2 may be connected to the i-th first scan line Si. The second transistor T2 is turned on when the scan signal is supplied to the i-th first scan line Si and may electrically connect the j-th data line Dj and the first electrode of the first transistor T1.

The storage capacitor Cst may be connected between the first power ELVDD and the first node N1. The storage capacitor Cst may store the data signal and a voltage corresponding to a threshold voltage of the first transistor T1.

According to an exemplary embodiment of the present invention, extension directions of the scan lines and the emission control lines may vary. For example, rather than the scan lines and the emission control lines extending in the first direction DR1 that is the width direction, the scan lines and the emission control lines may extend in the second direction DR2 that is the length direction.

Figure 4:
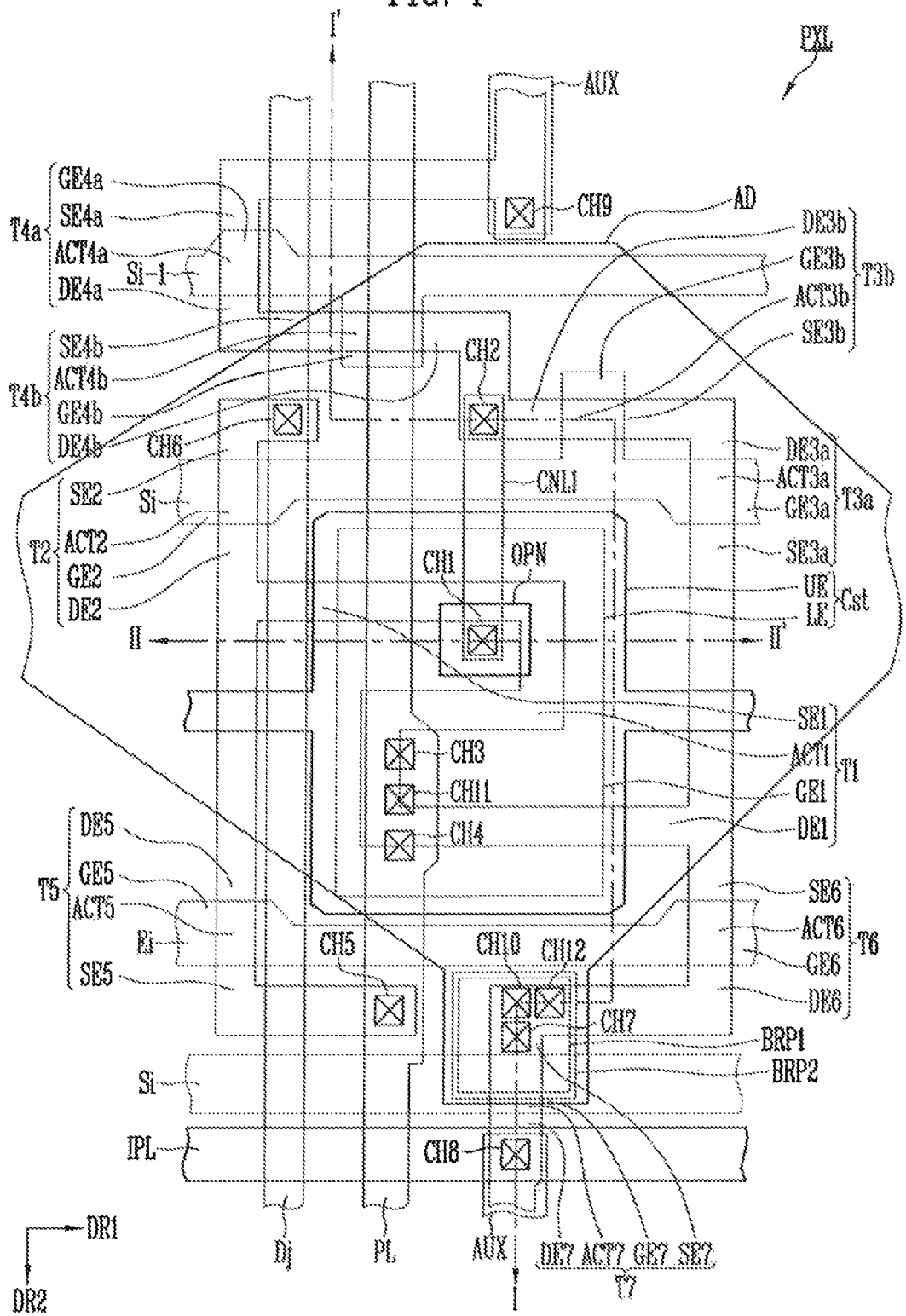
FIG. 4 is a plan view specifically illustrating the pixel of FIG. 3.
Figure 5:
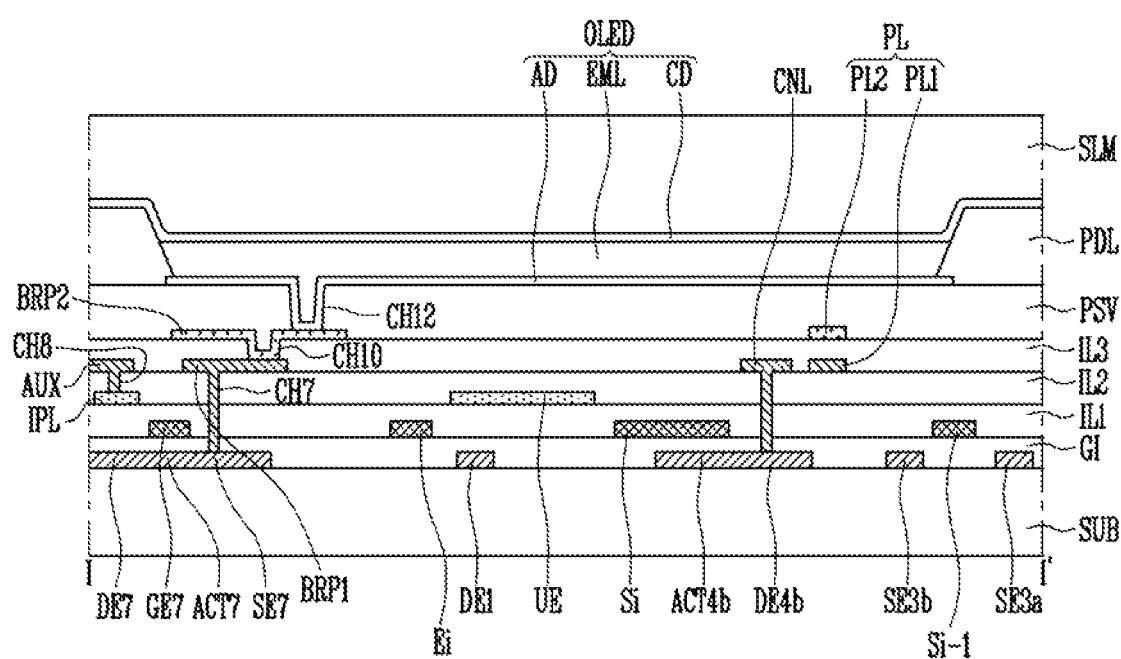
FIG. 5 is a cross-sectional view taken along the line I-I' of FIG. 4.
Figure 6:
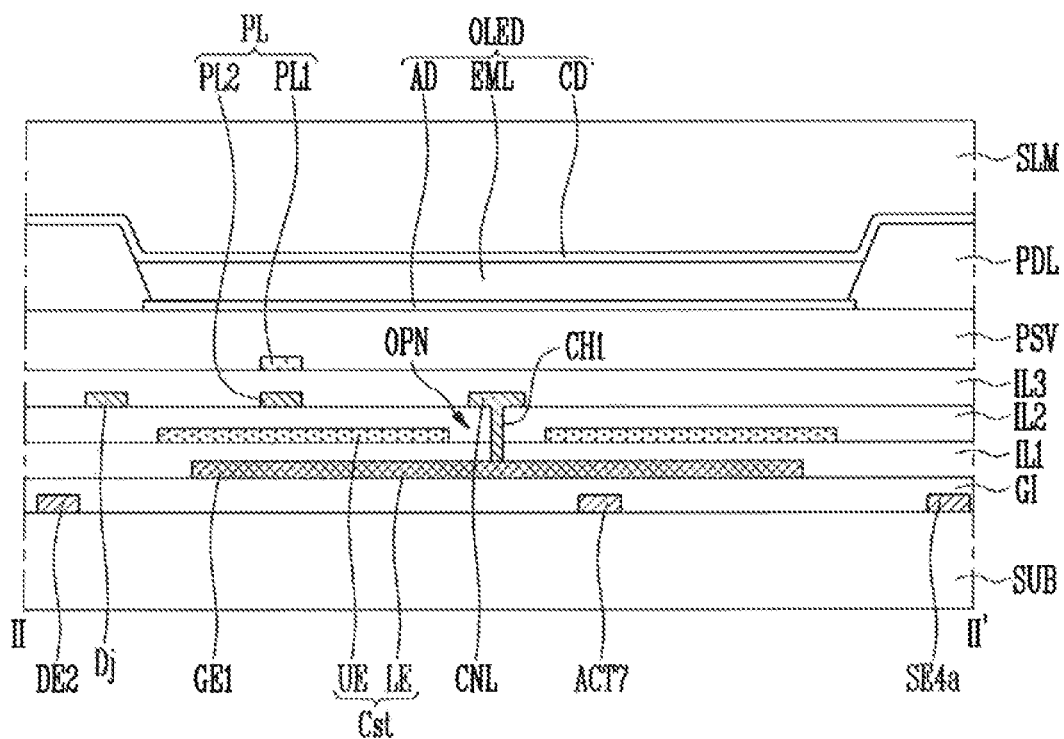
FIG. 6 is a cross-sectional view taken along the line II-IF of FIG. 4.

FIG. 4 is a plan view specifically illustrating the pixel of FIG. 3. FIG. 5 is a cross-sectional view taken along the line I-I' of FIG. 4. FIG. 6 is a cross-sectional view taken along the line II-IF of FIG. 4.

In FIGS. 4 through 6, based on a pixel PXL arranged in an i-th row and a j-th column in the pixel region PXA, the two scan lines Si−1 and Si, the emission control line Ei, the power line PL, and the data line Dj that are connected to the pixel PXL are illustrated. In FIGS. 4 through 6, for convenience sake, a scan line in an (i−1)th row is referred to as "the (i−1)th scan line Si−1", a scan line in the i-th row is referred to as "the i-th scan line Si", an emission control line in the i-th row is referred to as "the emission control line Ei", a data line in the j-th column is referred to as "the data line Dj", and a j-th power line is referred to as "the power line PL".

Referring to FIGS. 2 through 6, the display device may include the substrate SUB, the wiring line unit, and the pixels PXL.

The substrate SUB includes a transparent insulating material and may transmit light. The substrate SUB may be a rigid substrate. For example, the substrate SUB may be a glass substrate, a quartz substrate, a glass ceramic substrate, or a crystalline glass substrate.

In addition, the substrate SUB may be a flexible substrate. Here, the substrate SUB may be a film substrate or a plastic substrate including a high molecular organic material. For example, the substrate SUB may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. The material of which the substrate SUB is formed may vary and may include fiber reinforced plastic (FRP).

The wiring line unit provides signals to the pixels PXL and may include the scan lines Si−1 and Si, the data line Dj, the emission control line Ei, the power line PL, and an initializing power line IPL.

The scan lines Si−1 and Si may extend in the first direction DR1. The scan lines Si−1 and Si may include the (i−1)th scan line Si−1 and the i-th scan line Si that are sequentially arranged in the second direction DR2. The scan lines Si−1 and Si may receive scan signals. For example, the (i−1)th scan line Si−1 may receive an (i−1)th scan signal. On the (i−1)th scan line Si−1, pixels PXL in the i-th row may be initialized by the (i−1)th scan signal. The i-th scan line Si may receive an i-th scan signal. The i-th scan line Si is divided and may be connected to different transistors.

The emission control line Ei may extend in the first direction DR1. The emission control line Ei is arranged between the divided i-th scan lines Si to be separate from the i-th scan lines Si. The emission control line Ei may receive the emission control signal.

The data line Dj may extend in the second direction DR2. The data line Dj may receive a data signal.

The power line PL may extend in the second direction DR2. The power line PL may be arranged to be separate from the data line Dj. The power line PL may receive the first power (refer to ELVDD of FIGS. 2 and 3).

The initializing power line IPL may extend in the first direction DR1. The initializing power line IPL may be disposed between the pixels PXL in the i-th row and pixels PXL in an (i+1)th row. The initializing power line IPL may receive the initializing power Vint.

Each of the pixels PXL may include a first transistor T1, a second transistor T2, a third transistor T3, a fourth transistor T4, a fifth transistor T5, a sixth transistor T6, a seventh transistor T7, a storage capacitor Cst, and an OLED "OLED".

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect the first gate electrode GE1, the third drain electrode DE3, and the fourth drain electrode DE4. One end of the connection line CNL is connected to the first gate electrode GE1 through a first contact hole CH1 and the other end of the connection line CNL may be connected to the third drain electrode DE3 and the fourth drain electrode DE4 through a second contact hole CH2.

According to an exemplary embodiment of the present invention, the first active pattern ACT1, the first source electrode SE1, and the first drain electrode DE1 may each be formed of semiconductor layers that are not doped with impurities or that are doped with impurities. For example, the first source electrode SE1 and the first drain electrode DE1 are formed of a semiconductor layer doped with impurities and the first active pattern ACT1 may be formed of a semiconductor layer that is not doped with impurities.

The first active pattern ACT1 may be bar-shaped, may extend in a predetermined direction, and may be bent a plurality of times in a length direction in which the first active pattern ACT1 extends. The first active pattern ACT1 may overlap the first gate electrode GE1, as seen from a plane. Since the first active pattern ACT1 extends longitudinally, a channel region of the first transistor T1 may extend longitudinally as well. Therefore, a driving range of a gate voltage applied to the first transistor T1 may increase. Therefore, grayscale of light emitted by the OLED "OLED" may be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be connected to the i-th scan line Si. The second gate electrode GE2 is disposed as a part of the i-th scan line Si or may be disposed to protrude from the i-th scan line Si. According to an exemplary embodiment of the present invention, the second active pattern ACT2, the second source electrode SE2, and the second drain electrode DE2 may each be formed of semiconductor layers that are not doped with impurities or that are doped with impurities. For example, the second source electrode SE2 and the second drain electrode DE2 are formed of a semiconductor layer doped with impurities and the second active pattern ACT2 may be formed of a semiconductor layer that is not doped with impurities. The second active pattern ACT2 may overlap the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may have a double gate structure that prevents leakage current. For example, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Hereinafter, the 3a-th gate electrode GE3a and the 3b-th gate electrode GE3b are referred to as a third gate electrode GE3, the 3a-th active pattern ACT3a and the 3b-th active pattern ACT3b are referred to as a third active pattern ACT3, the 3a-th source electrode SE3*a* and the 3b-th source electrode SE3*b* are referred to as a third source electrode SE3, and the 3a-th drain electrode DE3*a* and the 3b-th drain electrode DE3*b* are referred to as a third drain electrode DE3.

The third gate electrode GE3 may be connected to the i-th scan line Si. The third gate electrode GE3 is disposed as a part of the i-th scan line Si or may be disposed to protrude from the i-th scan line Si. For example, the 3a-th gate electrode GE3*a* is disposed to protrude from the i-th scan line Si and the 3b-th gate electrode GE3*b* may be disposed as a part of the i-th scan line Si.

The third active pattern ACT3, the third source electrode SE3, and the third drain electrode DE3 may each be formed of semiconductor layers that are not doped with impurities or that are doped with impurities. For example, the third source electrode SE3 and the third drain electrode DE3 are formed of a semiconductor layer doped with impurities and the third active pattern ACT3 may be formed of a semiconductor layer that is not doped with impurities. The third active pattern ACT3 may overlap the third gate electrode GE3. One end of the third source electrode SE3 may be connected to the third active pattern ACT3. The other end of the third source electrode SE3 may be connected to the first drain electrode DE1 of the first transistor T1 and a sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. In addition, the third drain electrode DE3 may be connected to the first gate electrode GE1 of the first transistor T1 through the connection line CNL, the second contact hole CH2, and the first contact hole CH1.

The fourth transistor T4 may have a double gate structure that prevents leakage current. For example, the fourth transistor T4 may include a 4a-th transistor T4*a* and a 4b-th transistor T4*b*. The 4a-th transistor T4*a* may include a 4a-th gate electrode GE4*a*, a 4a-th active pattern ACT4*a*, a 4a-th source electrode SE4*a*, and a 4a-th drain electrode DE4*a*. The 4b-th transistor T4*b* may include a 4b-th gate electrode GE4*b*, a 4b-th active pattern ACT4*b*, a 4b-th source electrode SE4*b*, and a 4b-th drain electrode DE4*b*. Hereinafter, the 4a-th gate electrode GE4*a* and the 4b-th gate electrode GE4*b* are referred to as a fourth gate electrode GE4. The 4a-th active pattern ACT4*a* and the 4b-th active pattern ACT4*b* are referred to as a fourth active pattern ACT4. The 4a-th source electrode SE4*a* and the 4b-th source electrode SE4*b* are referred to as a fourth source electrode SE4. The 4a-th drain electrode DE4*a* and the 4b-th drain electrode DE4*b* are referred to as a fourth drain electrode DE4.

The fourth gate electrode GE4 may be connected to the (i−1)th scan line Si−1. The fourth gate electrode GE4 is disposed as a part of the (i−1)th scan line Si−1 or may be disposed to protrude from the (i−1)th scan line Si−1. For example, the 4a-th gate electrode GE4*a* may be disposed as a part of the (i−1)th scan line Si−1 and the 4b-th gate electrode GE4*b* may be disposed to protrude from the (i−1)th scan line Si−1.

The fourth active pattern ACT4, the fourth source electrode SE4, and the fourth drain electrode DE4 may each be formed of semiconductor layers that are not doped with impurities or that are doped with impurities. For example, the fourth source electrode SE4 and the fourth drain electrode DE4 are formed of a semiconductor layer doped with impurities and the fourth active pattern ACT4 may be formed of a semiconductor layer that is not doped with impurities. The fourth active pattern ACT4 may overlap the fourth gate electrode GE4.

One end of the fourth source electrode SE4 may be connected to the fourth active pattern ACT4. The other end of the fourth source electrode SE4 may be connected to the initializing power line IPL of pixel PXL in the (i−1)th row and a seventh drain electrode DE7 of the seventh transistor T7 of the pixel PXL in the (i−1)th row. An auxiliary connection line AUX may be disposed between the fourth source electrode SE4 and the initializing power line IPL. One end of the auxiliary connection line AUX may be connected to the fourth source electrode SE4 through a ninth contact hole CH9. The other end of the auxiliary connection line AUX may be connected to the initializing power line IPL in the (i−1)th row through an eighth contact hole CH8 of the pixel PXL in the (i−1)th row. One end of the fourth drain electrode DE4 may be connected to the fourth active pattern ACT4. The other end of the fourth drain electrode DE4 may be connected to the third drain electrode DE3 of the third transistor T3. In addition, the fourth drain electrode DE4 may be connected to the first gate electrode GE1 of the first transistor Ti through the connection line CNL, the second contact hole CH2, and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the emission control line Ei. The fifth gate electrode GE5 is disposed as a part of the i-th emission control line Ei or may be disposed to protrude from the i-th emission control line Ei. The fifth active pattern ACT5, the fifth source electrode SE5, and the fifth drain electrode DE5 may each be formed of semiconductor layers that are not doped with impurities or that are doped with impurities. For example, the fifth source electrode SE5 and the fifth drain electrode DE5 are formed of a semiconductor layer doped with impurities and the fifth active pattern ACT5 may be formed of a semiconductor layer that is not doped with impurities. The fifth active pattern ACT5 may overlap the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the emission control line Ei. The sixth gate electrode GE6 is disposed as a part of the i-th emission control line Ei or may be disposed to protrude from the i-th emission control line Ei. The sixth active pattern ACT6, the sixth source electrode SE6, and the sixth drain electrode DE6 may each be formed of semiconductor layers that are not doped with impurities or that are doped with impurities. For example, the sixth source electrode SE6 and the sixth drain electrode DE6 are formed of a semiconductor layer doped with impurities and the sixth active pattern ACT6 may be formed of a semiconductor layer that is not doped with impurities. The sixth active pattern ACT6 may overlap the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, a seventh source electrode SE7, and a seventh drain electrode DE7.

The seventh gate electrode GE7 may be connected to the i-th scan line Si. The seventh gate electrode GE7 is disposed as a part of the i-th scan line Si or may be disposed to protrude from the i-th scan line Si. The seventh active pattern ACT7, the seventh source electrode SE7, and the seventh drain electrode DE7 may each be formed of semiconductor layers that are not doped with impurities or that are doped with impurities. For example, the seventh source electrode SE7 and the seventh drain electrode DE7 are formed of a semiconductor layer doped with impurities and the seventh active pattern ACT7 may be formed of a semiconductor layer that is not doped with impurities. The seventh active pattern ACT7 may overlap the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initializing power line IPL. In addition, the seventh drain electrode DE7 may be connected to the fourth source electrode SE4 of the fourth transistor T4 of the pixel PXL in the (i+1)th row. The seventh drain electrode DE7 and the fourth source electrode SE4 of the fourth transistor T4 of the pixel PXL in the (i+1)th row may be connected through the auxiliary line AUX, the eighth contact hole CH8, and the ninth contact hole CH9.

The storage capacitor Cst may include a lower electrode LE and an upper electrode UE. The lower electrode LE may be formed of the first gate electrode GE1 of the first transistor T1.

The upper electrode UE overlaps the first gate electrode GE1 and may cover the lower electrode LE, as may be seen from a plane. Capacitance of the storage capacitor Cst may be increased by increasing an overlap area between the upper electrode UE and the lower electrode LE. The upper electrode UE may extend in the first direction DR1. According to an exemplary embodiment of the present invention, a voltage at the same level as the first power ELVDD may be applied to the upper electrode UE. The upper electrode UE may have an opening OPN in a region in which the first gate electrode GE1 and the connection line CNL contact and in which the first contact hole CH1 is formed.

The OLED "OLED" may include a first electrode AD, a second electrode CD, and an emission layer EML disposed between the first electrode AD and the second electrode CD.

The first electrode AD may be disposed in an emission region corresponding to each pixel PXL. The first electrode AD may be connected between the seventh source electrode SE7 of the seventh transistor T7 and the sixth drain electrode DE6 of the sixth transistor T6 through the seventh contact hole CH7, a tenth contact hole CH10, and a 12$^{th}$ contact hole CH12. A first bridge pattern BRP1 is disposed between the seventh contact hole CH7 and the tenth contact hole CH10 and a second bridge pattern BRP2 may be disposed between the tenth contact hole CH10 and the 12$^{th}$ contact hole CH12.

The first electrode AD is electrically connected to the power line PL and may receive the first power (refer to ELVDD of FIGS. 2 and 3). The second electrode CD may be connected to the second power (refer to ELVSS of FIGS. 2 and 3).

The first bridge pattern BRP1 and the second bridge pattern BRP2 may connect the sixth drain electrode DE6, the seventh source electrode SE7, and the first electrode AD.

Hereinafter, referring to FIGS. 4 through 6, a structure of the display device according to an exemplary embodiment of the present invention will be described in an order in which elements are laminated.

The active patterns ACT1 through ACT7 (hereinafter, referred to as ACT) may be disposed on the substrate SUB. The active patterns ACT may include the first through seventh active patterns ACT1 through ACT7. The first through seventh active patterns ACT1 through ACT7 may include a semiconductor material.

A buffer layer may be disposed between the substrate SUB and the first through seventh active patterns ACT1 through ACT7.

A gate insulating layer GI may be disposed on the substrate SUB on which the active patterns ACT are formed.

The (i−1)th scan line Si−1, the i-th scan line Si, the emission control line Ei, and the first through seventh gate electrodes GE1 through GE7 may be disposed on the gate insulating layer GI. The first gate electrode GE1 may be the lower electrode LE of the storage capacitor Cst. The second gate electrode GE2 and the third gate electrode GE3 may be integrated with the i-th scan line Si. The fourth gate electrode GE4 may be integrated with the (i−1)th scan line Si−1. The fifth gate electrode GE5 and the sixth gate electrode GE6 may be integrated with the i-th emission control line Ei. The seventh gate electrode GE7 may be integrated with the i-th scan line Si.

A first interlayer insulating layer IL1 may be disposed on the substrate SUB on which the (i−1)th scan line Si−1 is formed.

The upper electrode UE of the storage capacitor Cst and the initializing power line IPL may be disposed on the first interlayer insulating layer ILL The upper electrode UE may cover the lower electrode LE. The upper electrode UE may form the storage capacitor Cst together with the lower electrode LE with the first interlayer insulating layer IL1 interposed between the upper electrode UE and the lower electrode LE.

A second interlayer insulating layer IL2 may be disposed on the substrate SUB on which the upper electrode UE and the initializing power line IPL are arranged.

The data line Dj, the connection line CNL, the auxiliary connection line AUX, the first bridge pattern BRP1, and the first conductive layer PL1 of the power line PL may be disposed on the second interlayer insulating layer IL2.

The data line Dj may be connected to the second source electrode SE2 through the sixth contact hole CH6 that passes through the first interlayer insulating layer ILL the second interlayer insulating layer IL2, and the gate insulating layer GI.

The connection line CNL may be connected to the first gate electrode GE1 through the first contact hole CH1 that passes through the first interlayer insulating layer IL1 and the second interlayer insulating layer IL2. In addition, the connection line CNL may be connected to the third drain electrode DE3 and the fourth drain electrode DE4 through the second contact hole CH2 that passes through the gate insulating layer GI, the first interlayer insulating layer ILL and the second interlayer insulating layer IL2.

The auxiliary connection line AUX may be connected to the initializing power line IPL through the eighth contact hole CH8 that passes through the second interlayer insulating layer IL2. In addition, the auxiliary connection line AUX may be connected to the fourth source electrode SE4 and the seventh drain electrode DE7 of the pixel PXL in the (i−1)th row through the ninth contact hole CH9 that passes through the gate insulating layer GI, the first interlayer insulating layer ILL and the second interlayer insulating layer IL2.

The first bridge pattern BRP1 may be disposed as a medium for connecting the sixth drain electrode DE6 and the first electrode AD between the sixth drain electrode DE6 and the first electrode AD. The first bridge pattern BRP1 may be connected to the sixth drain electrode DE6 and the first source electrode SE1 through the seventh contact hole CH7 that passes through the gate insulating layer GI, the first interlayer insulating layer ILL and the second interlayer insulating layer IL2.

The first conductive layer PL1 may be connected to the upper electrode UE of the storage capacitor Cst through the third contact hole CH3 and the fourth contact hole CH4 that pass through the second interlayer insulating layer IL2. The first conductive layer PL1 may be connected to the fifth source electrode SE5 through the fifth contact hole CH5 that passes through the first interlayer insulating layer ILL the second interlayer insulating layer IL2, and the gate insulating layer GI.

A third insulating layer IL3 may be disposed on the substrate SUB on which the j-th data line Dj is formed.

A second conductive layer PL2 of the power line PL and the second bridge pattern BRP2 may be disposed on the third insulating layer IL3. The second bridge pattern BRP2 may be connected to the first bridge pattern BRP1 through the tenth contact hole CH10.

The second conductive layer PL2 overlaps the first conductive layer PL1 and may be connected to the first conductive layer PL1 through an $11^{th}$ contact hole CH11 that passes through the third insulating layer IL3. Therefore, since the power line PL includes the first conductive layer PL1 and the second conductive layer PL2 and the first conductive layer PL1 and the second conductive layer PL2 are electrically connected, it is possible to prevent voltage drop of power supplied through the power line PL, for example, the first power ELVDD.

A protective layer PSV may be disposed on the third insulating layer IL3 on which the second conductive layer PL2 and the second bridge pattern BRP2 are disposed.

The OLED "OLED" may be disposed on the protective layer PSV. The OLED "OLED" may include the first electrode AD, the second electrode CD, and the emission layer EML disposed between the first electrode AD and the second electrode CD.

The first electrode AD may be disposed on the protective layer PSV. The first electrode AD may be connected to the second bridge pattern BRP2 through the $12^{th}$ contact hole CH12 that passes through the protective layer PSV. Therefore, the first electrode AD may be electrically connected to the first bridge pattern BRP1. Since the first bridge pattern BRP1 is connected to the sixth drain electrode DE6 and the seventh source electrode SE7 through the seventh contact hole CH7, the first electrode AD may be electrically connected to the sixth drain electrode DE6 and the seventh source electrode SE7.

A pixel defining layer PDL that partitions off an emission region to correspond to the respective pixels PXL may be disposed on the substrate SUB on which the first electrode AD is formed. The pixel defining layer PDL may protrude from the substrate SUB along a circumference of the pixel PXL while exposing an upper surface of the first electrode AD.

The emission layer EML is disposed in the emission region surrounded by the pixel defining layer PDL and the second electrode CD may be disposed on the emission layer EML. An encapsulation layer SLM that covers the second electrode CD may be disposed on the second electrode CD.

One of the first electrode AD and the second electrode CD may be an anode electrode and the other thereof may be a cathode electrode. For example, the first electrode AD may be an anode electrode and the second electrode CD may be a cathode electrode.

In addition, at least one of the first electrode AD and the second electrode CD may be a transmissive electrode. For example, when the OLED "OLED" is a rear emission type OLED, the first electrode AD is a transmissive electrode and the second electrode CD may be a reflective electrode. When the OLED "OLED" is a front emission type OLED, the first electrode AD is a reflective electrode and the second electrode CD may be a transmissive electrode. When the OLED "OLED" is a double-side emission type OLED, both the first electrode AD and the second electrode CD may be transmissive electrodes. According to an exemplary embodiment of the present invention, it is illustrated that the OLED "OLED" is a front emission type OLED and the first electrode AD is an anode electrode.

The first electrode AD may include a reflecting layer for reflecting light and a transparent conductive layer arranged on or under the reflecting layer. At least one of the transparent conductive layer and the reflecting layer may be connected to the seventh source electrode SE7.

The reflecting layer may include a material capable of reflecting light, for example, the reflecting layer may include one or more of aluminum (Al), silver (Ag), chromium (Cr), molybdenum (Mo), platinum (Pt), nickel (Ni), and/or an alloy of Al, Ag, Cr, Mo, Pt, and N1.

The transparent conductive layer may include a transparent conductive oxide. For example, the transparent conductive layer may include at least one transparent conductive oxide such as an indium tin oxide (ITO), an indium zinc oxide (IZO), an aluminum zinc oxide (AZO), a gallium doped zinc oxide (GZO), a zinc tin oxide (ZTO), a gallium tin oxide (GTO), and/or a fluorine doped tin oxide (FTO).

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and/or silane based resin.

The emission layer EML may be arranged on an exposed surface of the first electrode AD. The emission layer EML may have a multilayer thin film structure including at least a light generation layer LGL. For example, the emission layer EML may include a hole injection layer HIL, a hole transport layer HTL, a light generating layer, hole blocking layer HBL, an electron transport layer ETL, and/or an electron injection layer EIL. The HIL injects holes. The hole transport layer HTL has a high transportability of holes for preventing electrons that are not combined in the emission layer from moving and increasing recombination probability of holes and electrons. The light generation layer emits light by a re-combination of injected electrons and holes. The hole blocking layer HBL prevents holes that are not combined in the light generation layer from moving. The electron transport layer ETL smoothly transports electrons to the light generation layer. The electron injection layer EIL injects electrons. In addition, in the emission layer EML, the hole injection layer HIL, the hole transport layer HTL, the hole blocking layer HBL, the electron transport layer ETL, and the electron injection layer EIL may be common layers that are commonly arranged in adjacent pixels PXL.

A color of light generated by the emission layer may be one of red, green, blue, and white. However, the present invention is not limited thereto. For example, a color of light generated by the emission layer may be one of magenta, cyan, and yellow.

The second electrode CD may be a semi-transmissive reflecting layer. For example, the second electrode CD may be a thin metal layer having a thickness capable of transmitting light emitted by the emission layer EML. The second electrode CD transmits a part of the light generated by the emission layer EML and may reflect the remaining light generated by the emission layer EML.

The second electrode CD may include a material with a lower work function than the transparent conductive layer. For example, the second electrode CD may include at least one of Mo, tungsten (W), Ag, magnesium (Mg), Al, Pt, palladium (Pd), gold (Au), Ni, neodymium (Nd), iridium (Ir), Cr, Lithium (Li), calcium (Ca), and an alloy of Mo, W, Ag, Mg, Al, Pt, Pd, Au, Ni, Nd, Ir, Cr, Li, and/or Ca.

A part of the light emitted by the emission layer EML does not transmit the second electrode CD and the light reflected from the second electrode CD may be reflected again from the reflecting layer. For example, the light emitted by the emission layer EML may resonate between the reflecting layer and the second electrode CD. Due to the resonance of the light, light extract efficiency of the OLED "OLED" may increase.

A distance between the reflecting layer and the second electrode CD may vary in accordance with a color of the light emitted by the emission layer EML. For example, the distance between the reflecting layer and the second electrode CD may be controlled to be suitable for a resonance distance in accordance with the color of the light emitted by the emission layer EML.

An encapsulation layer SLM may prevent external moisture and oxygen from permeating into the OLED "OLED". The encapsulation layer SLM may include a plurality of inorganic layers and a plurality of organic layers. For example, the encapsulation layer SLM may include a plurality of unit encapsulation layers each including an inorganic layer and an organic layer arranged on the inorganic layer. In addition, the inorganic layer may be arranged in the uppermost part of the encapsulation layer SLM. The inorganic layer may include at least one of a silicon oxide, a silicon nitride, a silicon oxynitride, an aluminum oxide, a titanium oxide, a zirconium oxide, and/or a tin oxide.

Figure 7:
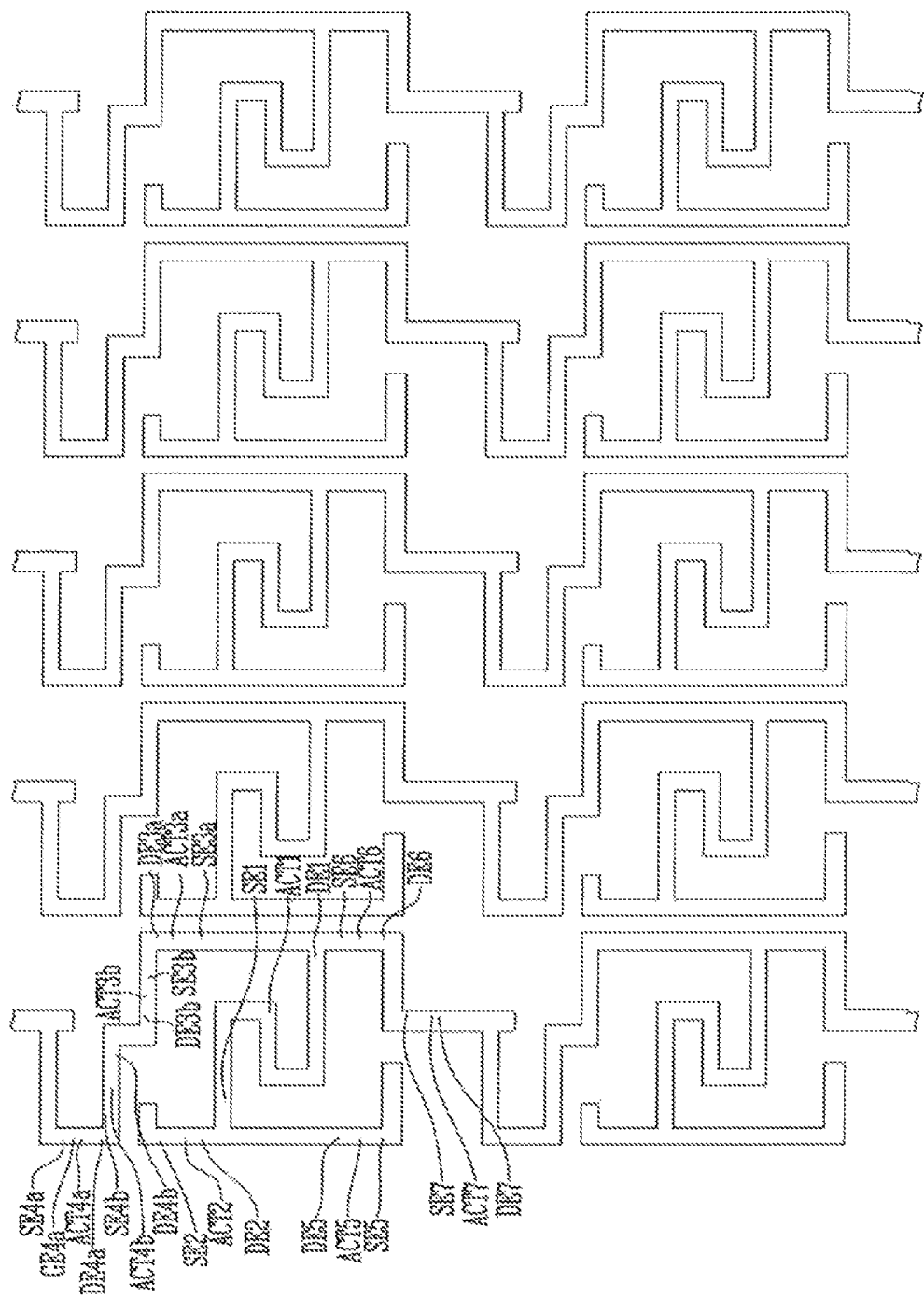
FIG. 7 is a plan view illustrating the active patterns of FIGS. 2 through 6.
Figure 8:
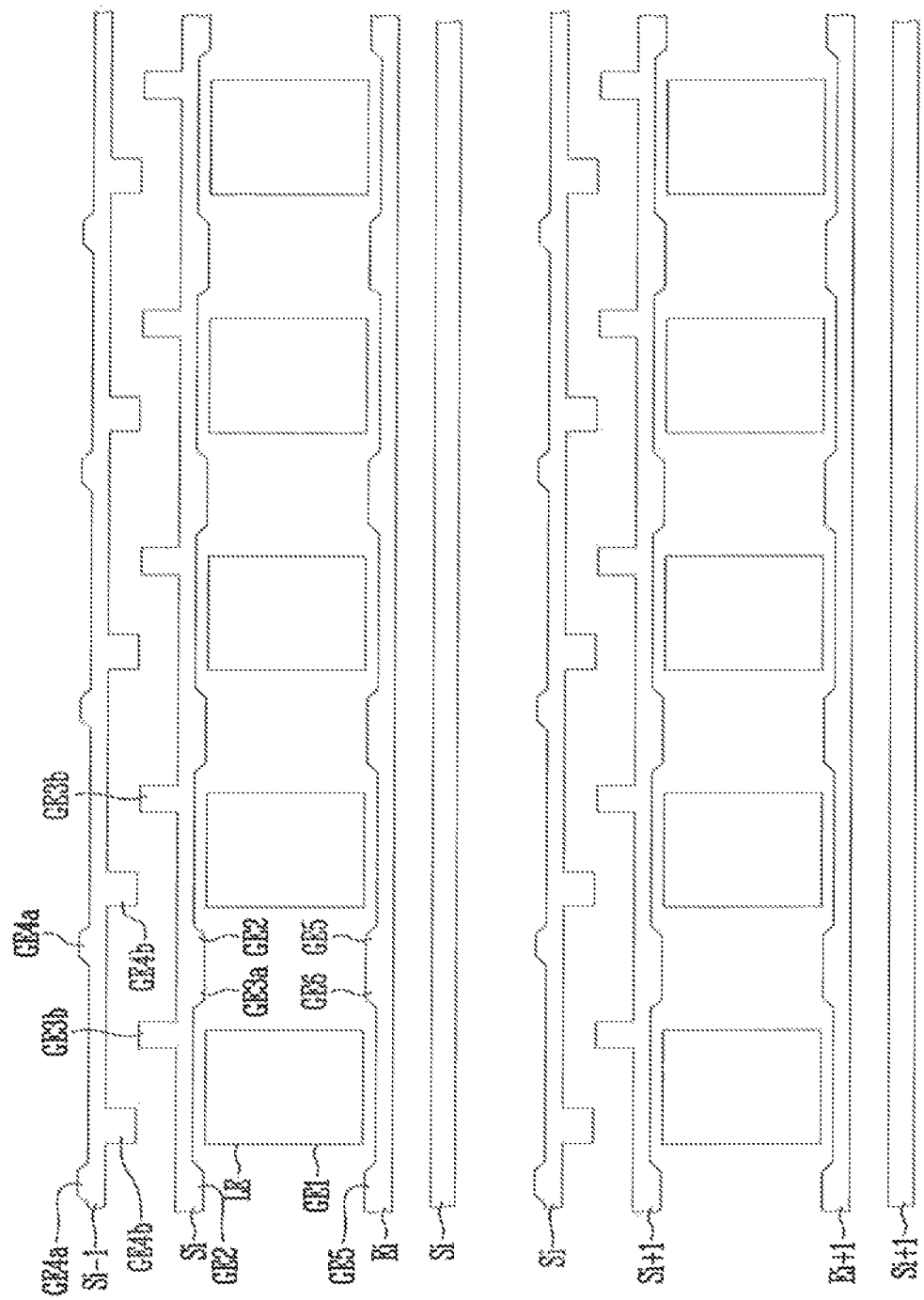
FIG. 8 is a plan view illustrating the scan lines, the emission control lines, and the lower electrode of the storage capacitor of FIGS. 2 through 6.
Figure 9:
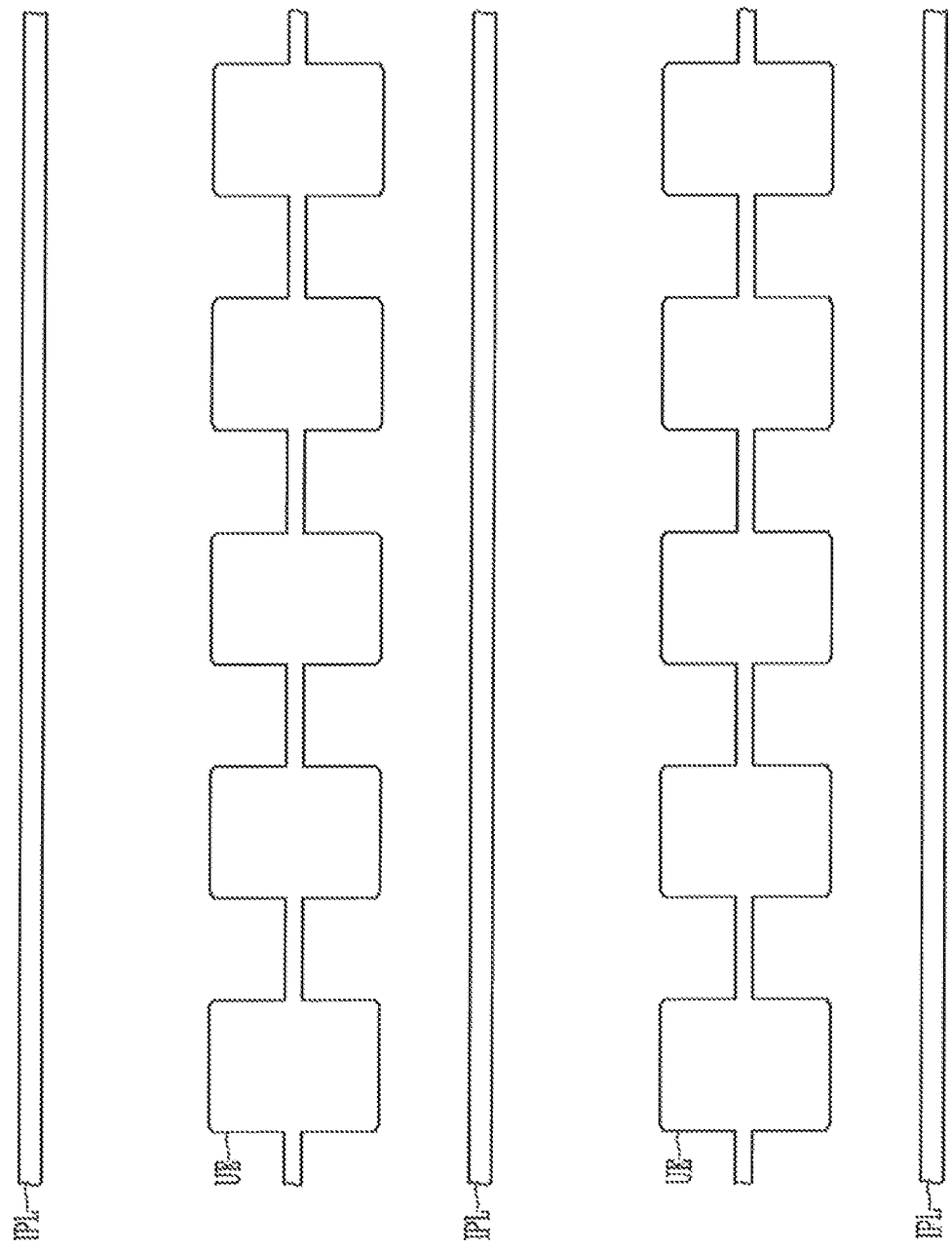
FIG. 9 is a plan view illustrating the initializing power line and the upper electrode of the storage capacitor of FIGS. 2 through 6.
Figure 10:
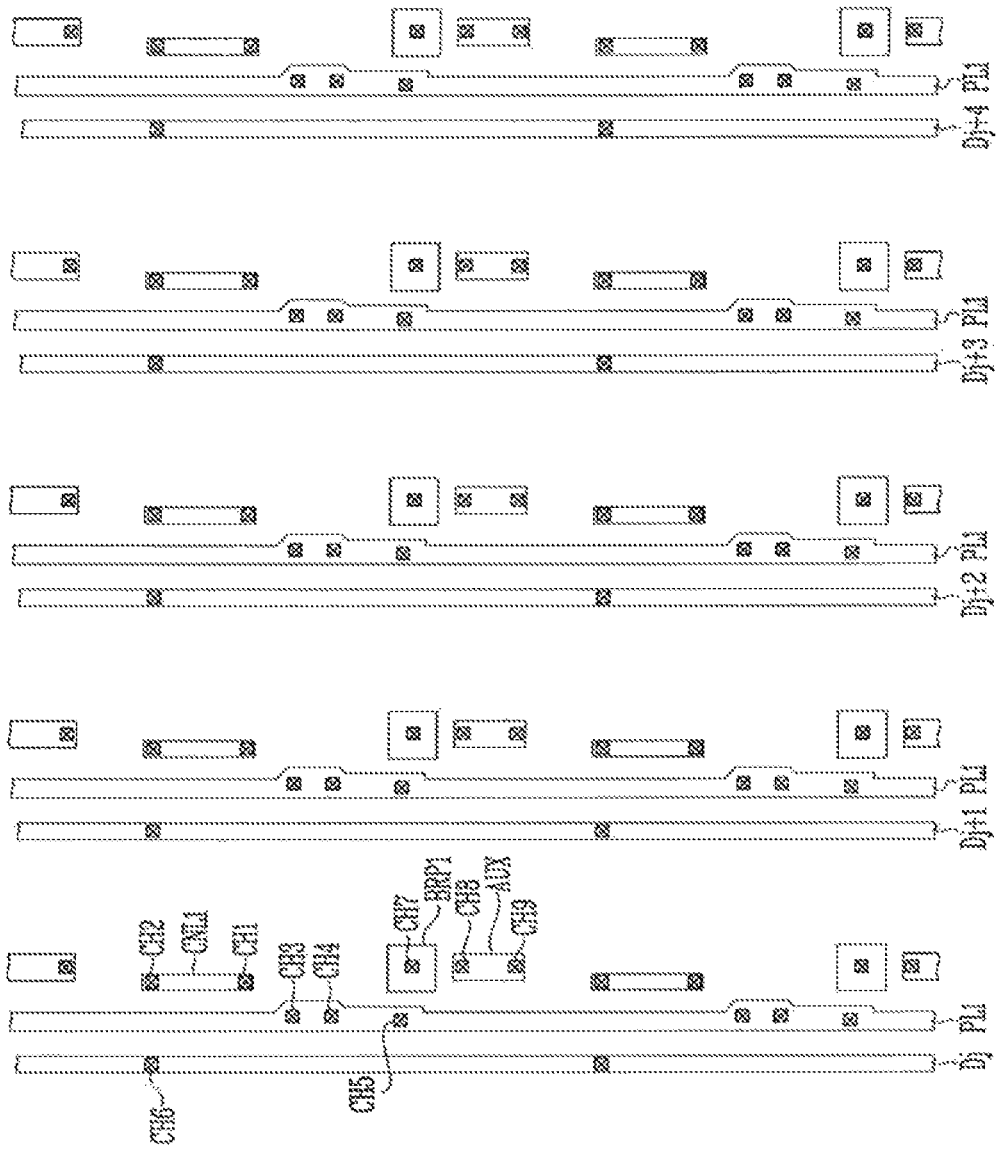
FIG. 10 is a plan view illustrating the data lines, the connection line, the auxiliary connection line, and the first conductive layer and the first bridge pattern of the power line of FIGS. 2 through 6.
Figure 11:
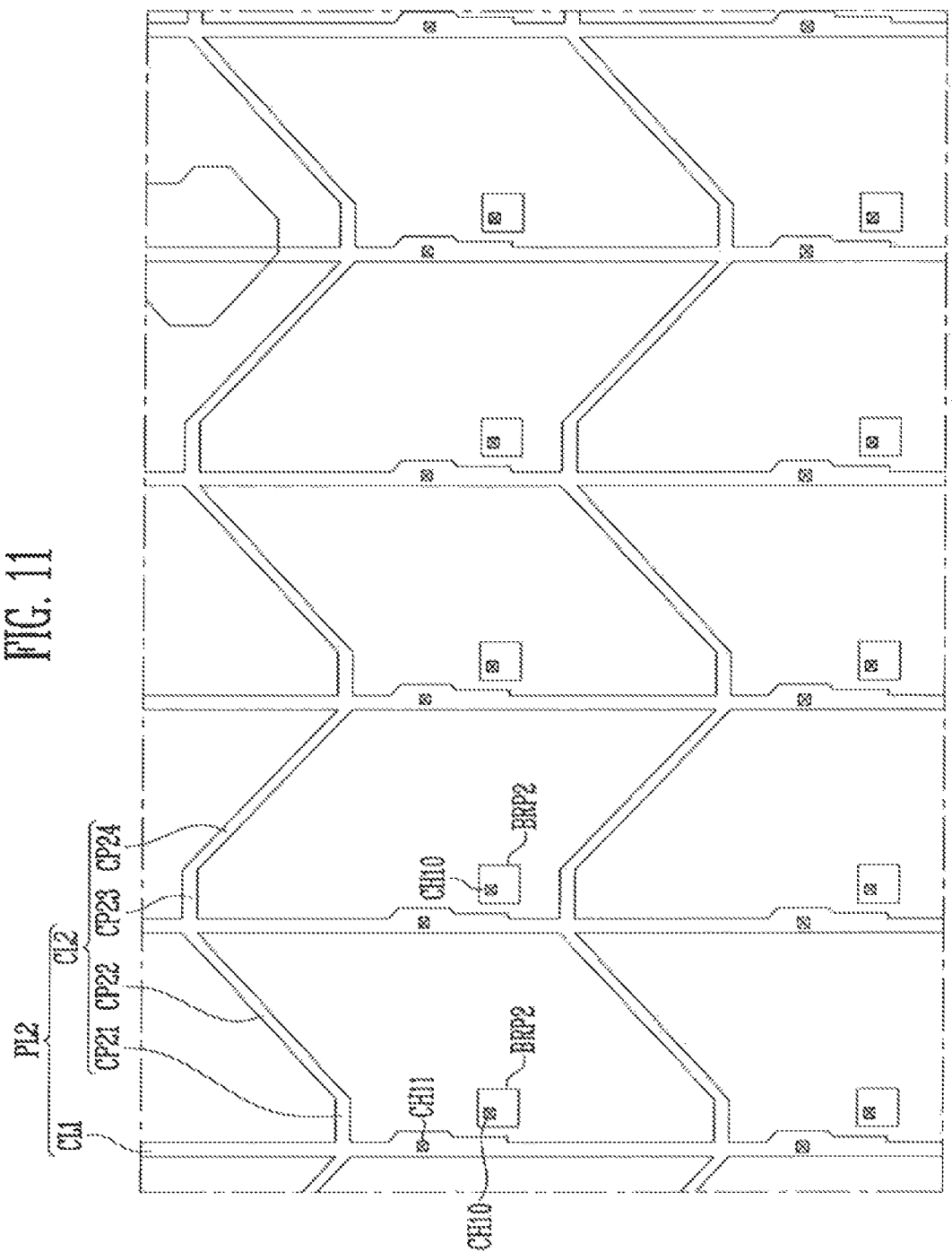
FIG. 11 is a plan view illustrating the second conductive layer and the second bridge pattern of the power line of FIGS. 2 through 6.
Figure 12:
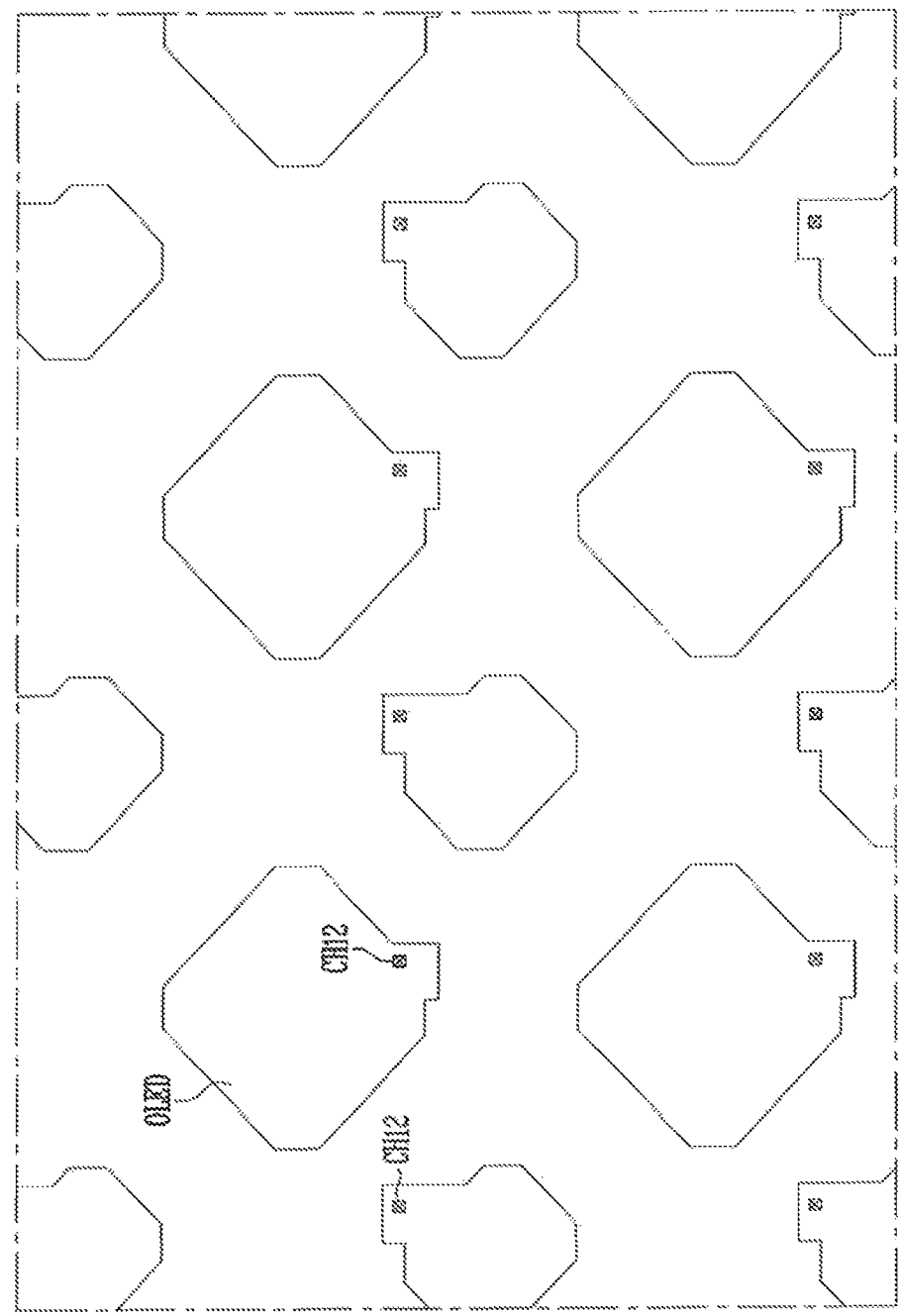
FIG. 12 is a plan view illustrating the organic light emitting diode (OLED) of FIGS. 2 through 6.
Figure 13:
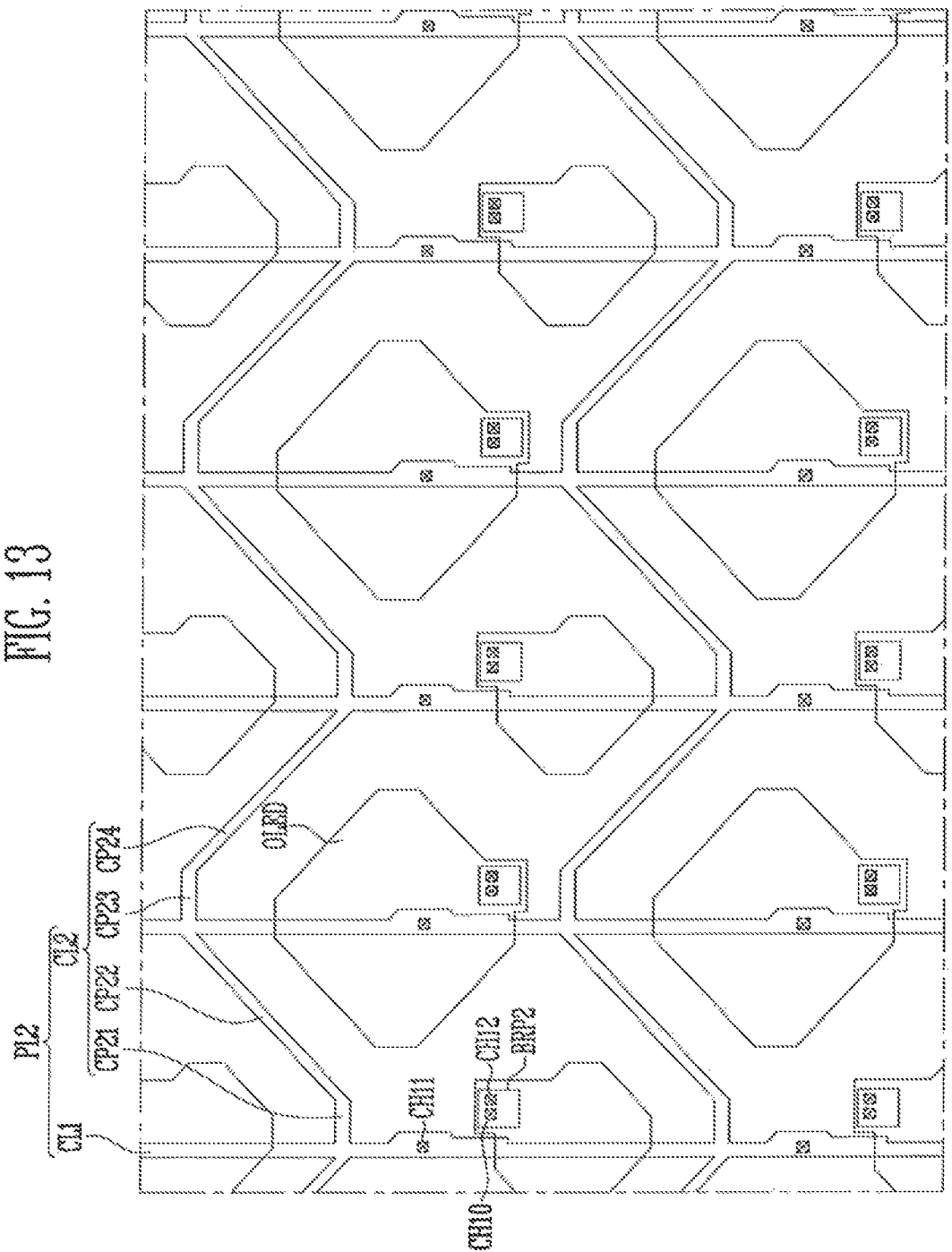
FIG. 13 is a plan view illustrating the second conductive layer and the second bridge pattern of the power line and the OLED of FIGS. 11 and 12.

FIG. 7 is a plan view illustrating the active patterns of FIGS. 2 through 6. FIG. 8 is a plan view illustrating the scan lines, the emission control lines, and the lower electrode of the storage capacitor of FIGS. 2 through 6. FIG. 9 is a plan view illustrating the initializing power line and the upper electrode of the storage capacitor of FIGS. 2 through 6. FIG. 10 is a plan view illustrating the data lines, the connection line, the auxiliary connection line, and the first conductive layer and the first bridge pattern of the power line of FIGS. 2 through 6. FIG. 11 is a plan view illustrating the second conductive layer and the second bridge pattern of the power line of FIGS. 2 through 6. FIG. 12 is a plan view illustrating the organic light emitting diode (OLED) of FIGS. 2 through 6. FIG. 13 is a plan view illustrating the second conductive layer and the second bridge pattern of the power line and the OLED of FIGS. 11 and 12. In FIGS. 7 through 12, for convenience sake, elements of the pixels in the i-th row and the (i+1)th row are illustrated in subsequent figures.

Referring to FIGS. 2 through 13, the first through seventh active patterns ACT1 through ACT7 may be disposed on the substrate SUB. The first through seventh active patterns ACT1 through ACT7 are disposed in the same layer and may be formed by the same process.

One end of the first active pattern ACT1 is connected to the first source electrode SE1 and the other end thereof may be connected to the first drain electrode DE1. One end of the second active pattern ACT2 is connected to the second source electrode SE2 and the other end thereof may be connected to the second drain electrode DE2. One end of the third active pattern ACT3 is connected to the third source electrode SE3 and the other end thereof may be connected to the third drain electrode DE3. One end of the fourth active pattern ACT4 is connected to the fourth source electrode SE4 and the other end thereof may be connected to the fourth drain electrode DE4. One end of the fifth active pattern ACT5 is connected to the fifth source electrode SE5 and the other end thereof may be connected to the fifth drain electrode DE5. One end of the sixth active pattern ACT6 is connected to the sixth source electrode SE6 and the other end thereof may be connected to the sixth drain electrode DE6. One end of the seventh active pattern ACT7 is connected to the seventh source electrode SE7 and the other end thereof may be connected to the seventh drain electrode DE7.

The scan lines Si−1, Si, and Si+1, the emission control lines Ei and Ei+1, and the lower electrode LE of the storage capacitor Cst may be disposed on the gate insulating layer GI formed on the first through seventh active patterns ACT1 through ACT7. The scan lines Si−1, Si, and Si+1, the emission control lines Ei and Ei+1, and the lower electrode LE of the storage capacitor Cst are disposed in the same layer and may be formed by the same process.

The scan lines Si−1, Si, and Si+1 may include the (i−1)th scan line Si−1, the i-th scan line Si, and the (i+1)th scan line Si+1.

In the i-th row, the first gate electrode GE1 is disposed to the lower electrode LE and the fourth gate electrode GE4 is disposed to the (i−1)th scan line Si−1. The second gate electrode GE2, the third gate electrode GE3, and the seventh gate electrode GE7 may be disposed to the i-th scan line Si. The fifth gate electrode GE5 and the sixth gate electrode GE6 may be disposed to the emission control line Ei.

In the (i+1)th row, the first gate electrode GE1 is disposed to the lower electrode LE and the fourth gate electrode GE4 is disposed to the i-th scan line Si. The second gate electrode GE2, the third gate electrode GE3, and the seventh gate electrode GE7 may be disposed to the (i+1)th scan line Si+1. The fifth gate electrode GE5 and the sixth gate electrode GE6 may be disposed to the emission control line Ei+1.

The initializing power line IPL and the upper electrode UE of the storage capacitor Cst may be disposed on the first interlayer insulating layer IL1 formed on the scan lines Si−1, Si, and Si+1, the emission control lines Ei and Ei+1, and the lower electrode LE of the storage capacitor Cst. The initializing power line IPL and the upper electrode UE of the storage capacitor Cst are disposed in the same layer and may be formed by the same process.

Data lines Dj, Dj+1, Dj+2, Dj+3, and Dj+4, the first conductive layer PL1 of the power line PL, the auxiliary connection line AUX, the connection line CNL, and the first bridge pattern BRP1 may be disposed on the second interlayer insulating layer IL2 formed on the initializing power line IPL and the upper electrode UE of the storage capacitor Cst. The data lines Dj, Dj+1, Dj+2, Dj+3, and Dj+4, the first conductive layer PL1 of the power line PL, the auxiliary connection line AUX, the connection line CNL, and the first bridge pattern BRP1 are disposed in the same layer and may be formed by the same process.

The data lines Dj, Dj+1, Dj+2, Dj+3, and Dj+4 may be connected to the second source electrode SE2 through the sixth contact hole CH6 that passes through the gate insulating layer GI, the first interlayer insulating layer IL1 and the second interlayer insulating layer IL2.

The first conductive layer PL1 may extend to run parallel with at least one of the data lines Dj, Dj+1, Dj+2, Dj+3, and Dj+4 and the scan lines Si−1, Si, and Si+1, for example, the data lines Dj, Dj+1, Dj+2, Dj+3, and Dj+4. The first conductive layer PL1 may be connected to the upper electrode UE through the third contact hole CH3 and the fourth contact hole CH4 that pass through the first conductive layer PL1 and the second interlayer insulating layer IL2. In addition, the first conductive layer PL1 may be connected to the fifth source electrode SE5 through the fifth contact hole CH5 that passes through the gate insulating layer GI, the first interlayer insulating layer IL1 and the second interlayer insulating layer IL2.

The connection line CNL may be connected to the first gate electrode GE through the first contact hole CH1 that passes through the first interlayer insulating layer IL1 and the second interlayer insulating layer IL2. In addition, the connection line CNL may be connected to the third drain electrode DE3 and the fourth drain electrode DE4 through the second contact hole CH2.

The auxiliary connection line AUX may be connected to the auxiliary power line IPL through the eighth contact hole CH8 that passes through the second interlayer insulating layer IL2. In addition, the auxiliary connection line AUX may be connected to the seventh drain electrode DE7 through the ninth contact hole CH9 that passes through the gate insulating layer GI, the first interlayer insulating layer IL1 and the second interlayer insulating layer IL2.

The first bridge pattern BRP1 may be connected to the seventh drain electrode DE6 and the seventh source electrode SE7 through the seventh contact hole CH7 that passes through the gate insulating layer GI, the first interlayer insulating layer IL1 and the second interlayer insulating layer IL2.

The second bridge pattern BRP2 and the second conductive layer PL2 may be disposed on a third interlayer insulating layer IL3 formed on the data line Dj, the power line PL, the auxiliary connection line AUX, the connection line CNL, and the first bridge pattern BRP1. The second bridge pattern BRP2 and the second conductive layer PL2 are disposed in the same layer and may be formed by the same process.

The second bridge pattern BRP2 may be connected to the first bridge pattern BRP1 through the tenth contact hole CH10.

The second conductive layer PL2 may include a plurality of first conductive lines CL1 and a plurality of second conductive lines CL2 that intersect the first conductive lines CL1.

One of the first conductive lines CL1 and the second conductive lines CL2, for example, the first conductive lines CL1 may run parallel with one of the data lines Dj, Dj+1, Dj+2, Dj+3, and Dj+4 and the scan lines Si−1, Si, and Si+1. The first conductive lines CL1 overlap the first conductive layer PL1 in parallel and may be connected to the first conductive layer PL1 through the 11$^{th}$ contact hole CH11 that passes through the third insulating layer IL3. Therefore, since the power line PL includes the first conductive layer PL1 and the second conductive layer PL2 and the first conductive layer PL1 and the second conductive layer PL2 are electrically connected, it is possible to prevent voltage drop of power supplied through the power line PL, for example, the first power ELVDD.

At least some of the first conductive lines CL1 and the second conductive lines CL2 may extend in a direction oblique to at least one of the data lines Dj, Dj+1, Dj+2, Dj+3, and Dj+4 and the scan lines Si−1, Si, and Si+1. For example, the second conductive lines CL2 may be disposed in a zigzag pattern in a direction that intersects the first conductive lines CL1. Since the second conductive lines CL2 are disposed in a zigzag pattern, the second conductive lines CL2 might not overlap the OLEDs "OLED". For example, the second conductive lines CL2 may be disposed in a region between adjacent OLEDs "OLED".

For example, the second conductive lines CL2 may include a plurality of conductive pattern units connected to each other. The conductive pattern units may include a first conductive pattern CP1, a second conductive pattern CP2, a third conductive pattern CP3, and a fourth conductive pattern CP4.

One end of the first conductive pattern CP1 may be connected to the second conductive pattern CP2. In addition, at least a part of the first conductive pattern CP1 may intersect one of the first conductive lines CL1.

One end of the second conductive pattern CP2 is connected to the one end of the first conductive pattern CP1 and may extend in a direction oblique to the first conductive lines CL1.

The third conductive pattern CP3 may extend to run parallel with the first conductive pattern CP1. One end of the third conductive pattern CP3 is connected to the other end of the second conductive pattern CP2 and the other end of the third conductive pattern CP3 may be connected to one end of the fourth conductive pattern CP4. In addition, at least a part of the third conductive pattern CP3 may intersect another one of the first conductive lines CL1.

The other end of the fourth conductive pattern CP4 may be connected to the other end of the first conductive pattern CP1 of an adjacent conductive pattern unit. Here, the fourth conductive pattern CP4 may extend in a direction that intersects the first conductive line CL1, the first conductive pattern CP1, the second conductive pattern CP2, and the third conductive pattern CP3.

When the first conductive lines CL1 and the second conductive lines CL2 of the second conductive layer PL2 overlap the OLEDs "OLED", step differences may be generated by the second conductive layer PL2 under the OLEDs "OLED". Due to the step differences, surfaces of the OLEDs "OLED" are not uniform and concavo-convex parts may be formed in partial regions of the OLEDs "OLED". For example, when surfaces from which light components are emitted have concavo-convex parts due to the step differences in the OLEDs "OLED", since the light components are not uniformly emitted by the OLEDs "OLED", color difference may be generated in accordance with a view angle of the display device including the OLEDs "OLED".

According to an exemplary embodiment of the present invention, a part of the second conductive layer PL2, for example, the second conductive lines CL2 may be disposed in a region between the OLEDs "OLED" without overlapping the OLEDs "OLED". Therefore, an overlap area between the second conductive layer PL2 and the OLEDs "OLED" may be reduced. When the overlap area between the second conductive layer PL2 and the OLEDs "OLED" is reduced, the step differences under the OLEDs "OLED" may be reduced. When the step differences are reduced, the concavo-convex parts of the surfaces from which the light components are emitted may be reduced in the OLEDs "OLED". Therefore, the light components generated by the OLEDs "OLED" may be uniformly emitted in accordance with a viewing direction. Therefore, the color difference in accordance with the view angle of the display device including the OLEDs "OLED" may be reduced.

The OLEDs "OLED" may be disposed on a protective layer PSV formed on the second conductive layer PL2 and the second bridge pattern BRP2. Each of the OLEDs "OLED" may include a first electrode AD formed on the protective layer PSV, an emission layer EML formed on the first electrode AD, and a second electrode CD formed on the emission layer EML.

The first electrode AD may be connected to the second bridge pattern BRP2 through the 12$^{th}$ contact hole CH12 that passes through the protective layer PSV.

Figure 14:
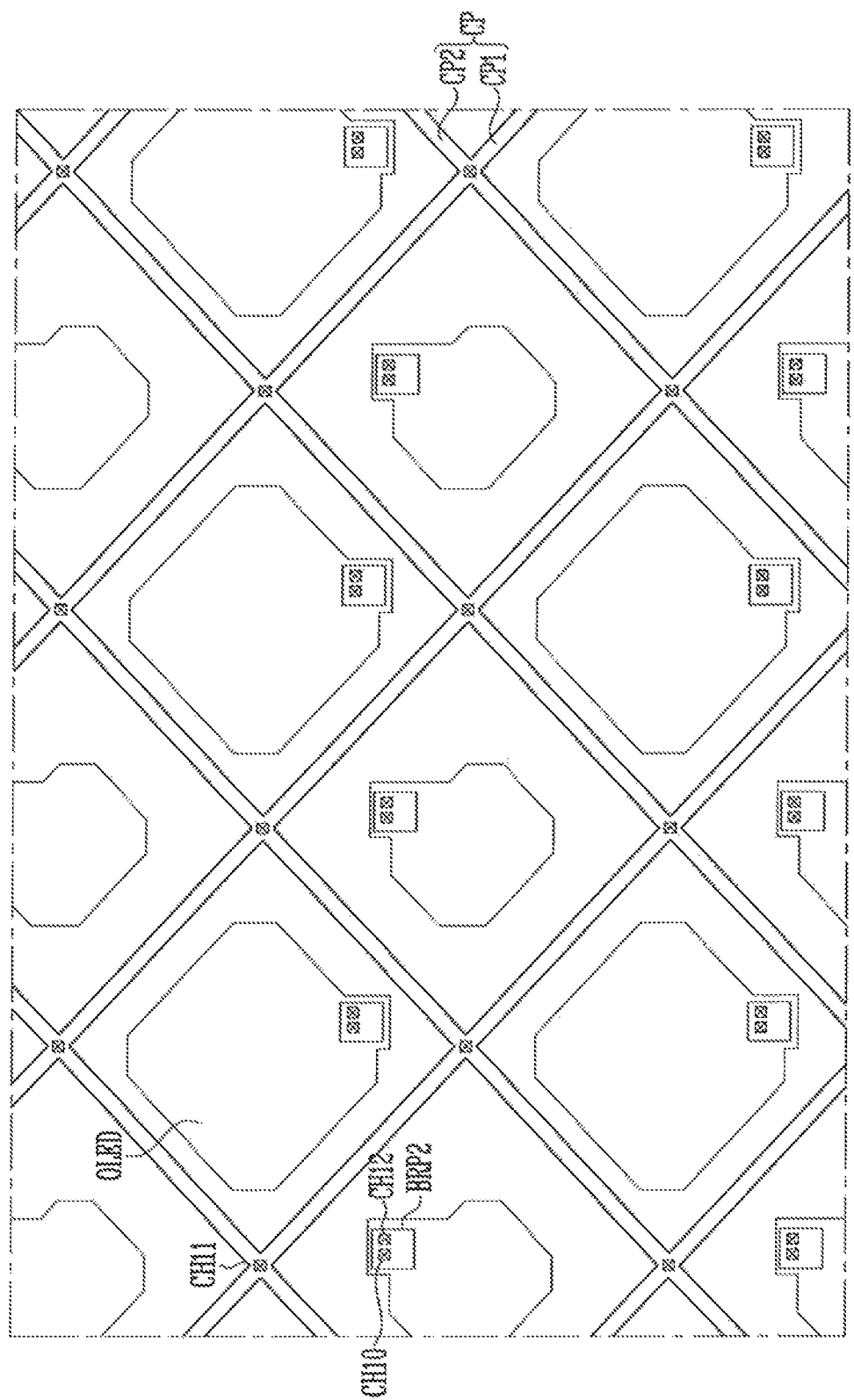
FIG. 14 is a plan view illustrating a second power line, a second bridge pattern, and an OLED of a display device according to an exemplary embodiment of the present invention.
Figure 15:
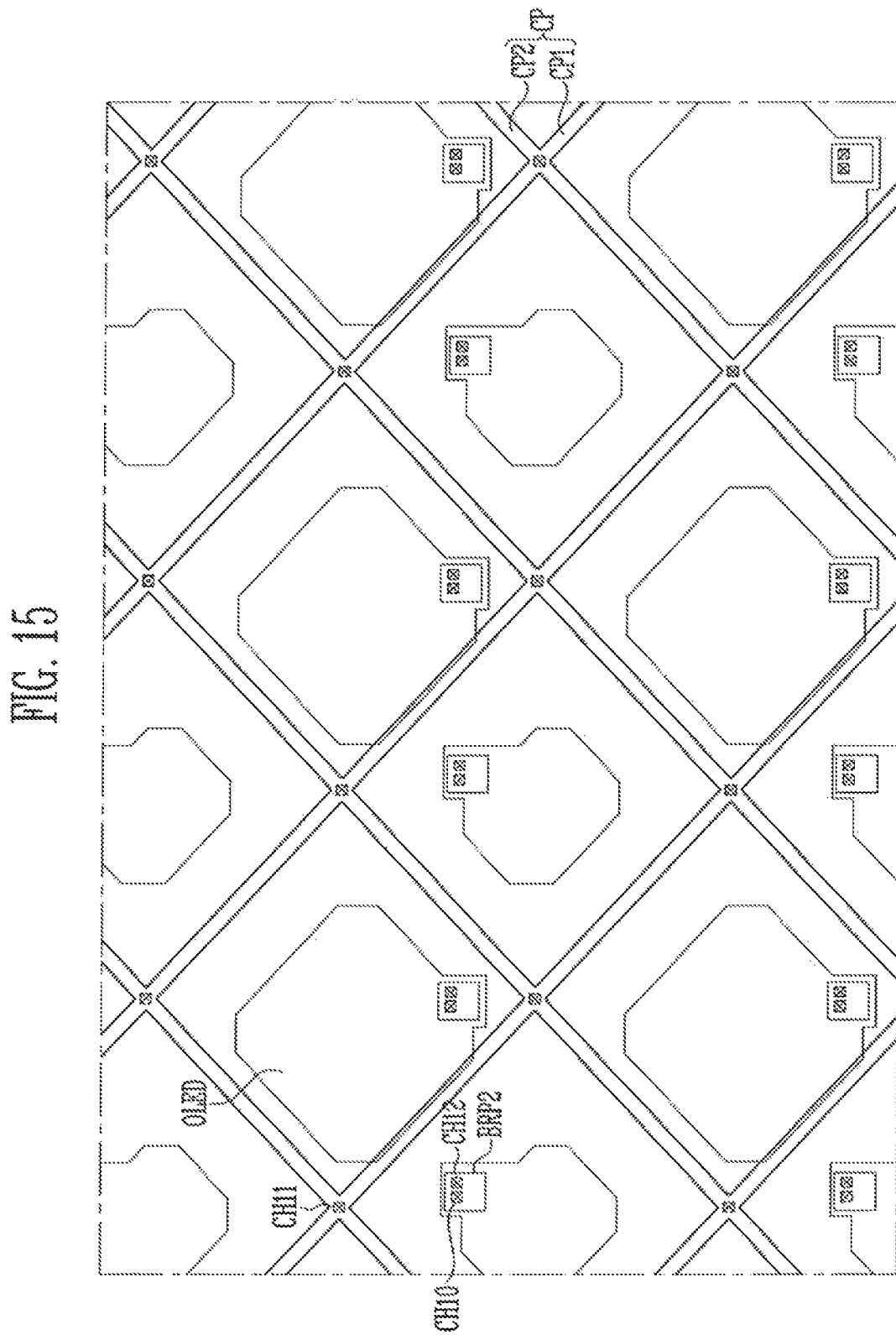
FIG. 15 is a plan view illustrating a second power line, a second bridge pattern, and an OLED of a display device according to an exemplary embodiment of the present invention.
Figure 16:
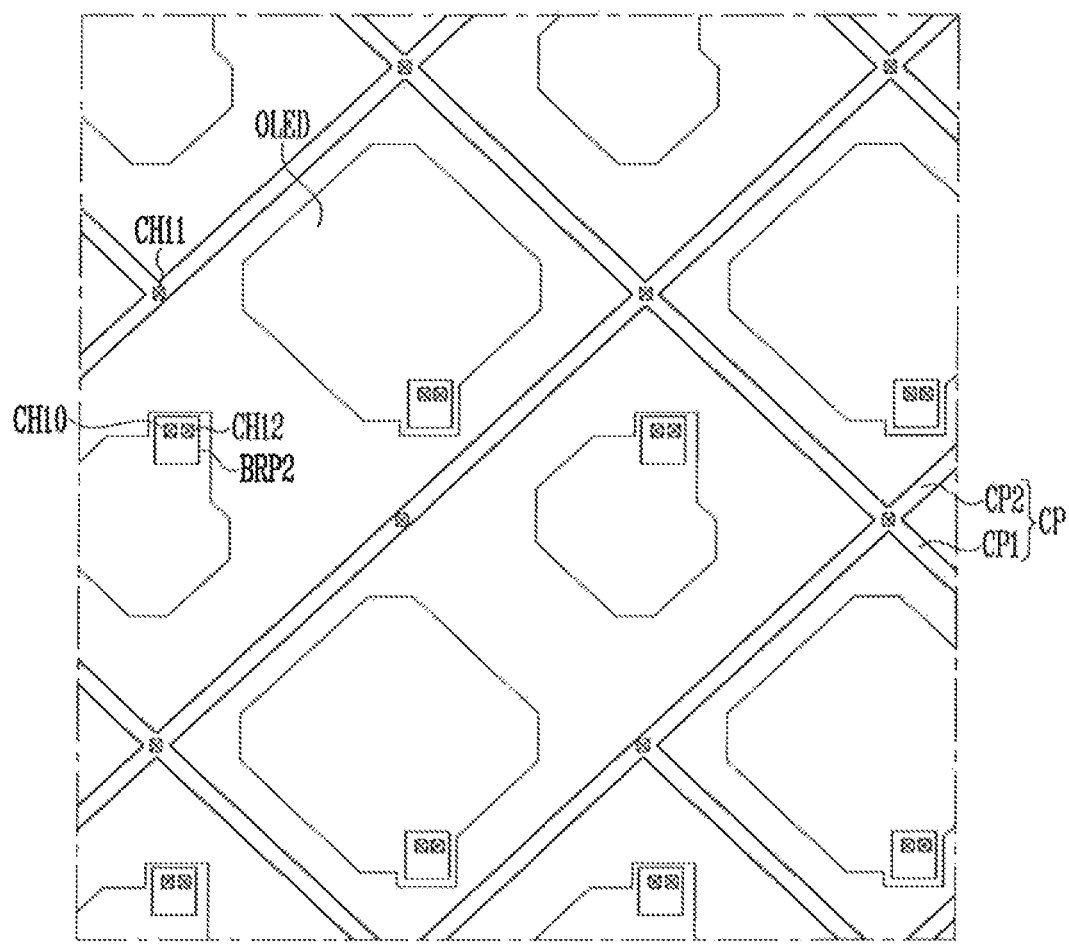
FIG. 16 is a plan view illustrating a second power line, a second bridge pattern, and an OLED of a display device according to an exemplary embodiment of the present invention.

Hereinafter, display devices according to exemplary embodiments of the present invention will be described with reference to FIGS. 14 through 16. Referring to FIGS. 14 through 16, the same elements as those of FIGS. 1 through 13 are denoted by the same reference numbers and brief description thereof will be given. In addition, in FIGS. 14 through 16, the description provided herein will focus mainly on different elements from those of FIGS. 1 through 13, and it is to be understood that the elements not described herein may be assumed to be similar to those described above.

FIG. 14 is a plan view illustrating a second power line, a second bridge pattern, and an OLED of a display device according to an exemplary embodiment of the present invention.

Referring to FIGS. 2 through 10 and 14, the first through seventh active patterns ACT1 through ACT7 may be disposed on the substrate SUB. The first through seventh active patterns ACT1 through ACT7 are disposed in the same layer and may be formed by the same process.

The scan lines Si−1, Si, and Si+1, the emission control lines Ei and Ei+1, and the lower electrode LE of the storage capacitor Cst may be disposed on the gate insulating layer GI formed on the first through seventh active patterns ACTT through ACT7. The scan lines Si−1, Si, and Si+1, the emission control lines Ei and Ei+1, and the lower electrode LE of the storage capacitor Cst are disposed in the same layer and may be formed by the same process.

The initializing power line IPL and the upper electrode UE of the storage capacitor Cst may be disposed on the first interlayer insulating layer IL1 formed on the scan lines Si−1, Si, and Si+1, the emission control lines Ei and Ei+1, and the lower electrode LE of the storage capacitor Cst. The initializing power line IPL and the upper electrode UE of the storage capacitor Cst are disposed in the same layer and may be formed by the same process.

The data lines Dj, Dj+1, Dj+2, Dj+3, and Dj+4, the first conductive layer PL1 of the power line PL, the auxiliary connection line AUX, the connection line CNL, and the first bridge pattern BRP1 may be disposed on the second interlayer insulating layer IL2 formed on the initializing power line IPL and the upper electrode UE of the storage capacitor Cst. The data lines Dj, Dj+1, Dj+2, Dj+3, and Dj+4, the first conductive layer PL1, the auxiliary connection line AUX, the connection line CNL, and the first bridge pattern BRP1 are disposed in the same layer and may be formed by the same process.

The second bridge pattern BRP2 and the second conductive layer PL2 may be disposed on the third interlayer insulating layer IL3 formed on the data line Dj, the power line PL, the auxiliary connection line AUX, the connection line CNL, and the first bridge pattern BRP1. The second bridge pattern BRP2 and the second conductive layer PL2 are disposed in the same layer and may be formed by the same process.

The second bridge pattern BRP2 may be connected to the first bridge pattern BRP1 through the tenth contact hole CH10.

The second conductive layer PL2 may be connected to the first conductive layer PL1 through the 11$^{th}$ contact hole CH11 that passes through the third insulating layer IL3. Therefore, since the power line PL includes the first conductive layer PL1 and the second conductive layer PL2 and the first conductive layer PL1 and the second conductive layer PL2 are electrically connected, it is possible to prevent voltage drop of the power supplied through the power line PL, for example, the first power ELVDD.

The second conductive layer PL2 may include the plurality of first conductive lines CL1 that extend in one direction and the plurality of second conductive lines CL2 that extend in a direction that intersects the first conductive lines CL1.

The first conductive lines CL1 and the second conductive lines CL2 may extend in a direction oblique to the data lines Dj, Dj+1, Dj+2, Dj+3, and Dj+4 and the scan lines Si−1, Si, and Si+1. The first conductive lines CL1 and the second conductive lines CL2 intersect each other and may form a plurality of regions. The OLEDs "OLED" may be respectively arranged in the regions formed by intersecting the first conductive lines CL1 and the second conductive lines CL2. For example, the first conductive lines CL1 and the second conductive lines CL2 do not overlap the OLEDs "OLED" and may be disposed in a region between adjacent OLEDs "OLED".

Since the first conductive lines CL1 and the second conductive lines CL2 are disposed in the region between the adjacent OLEDs "OLED", the step differences under the OLEDs "OLED" may be reduced by the power line PL. When the step differences are reduced under the OLEDs "OLED", the concavo-convex parts of the surfaces from which the light components are emitted may be reduced in the OLEDs "OLED". When the concavo-convex parts of the surfaces from which the light components are emitted are reduced in the OLEDs "OLED", the light components generated by the OLEDs "OLED" may be uniformly emitted in accordance with a direction. Therefore, the color difference in accordance with the view angle of the display device including the OLEDs "OLED" may be reduced.

The OLEDs "OLED" may be disposed on the protective layer PSV formed on the second conductive layer PL2 and the second bridge pattern BRP2. Each of the OLEDs "OLED" may include the first electrode AD formed on the protective layer PSV, the emission layer EML formed on the first electrode AD, and the second electrode CD formed on the emission layer EML.

The first electrode AD may be connected to the second bridge pattern BRP2 through the 12$^{th}$ contact hole CH12 that passes through the protective layer PSV.

FIG. 15 is a plan view illustrating a second power line, a second bridge pattern, and an OLED of a display device according to an exemplary embodiment of the present invention.

Referring to FIGS. 2 through 10 and 15, the first through seventh active patterns ACT1 through ACT7 may be disposed on the substrate SUB. The first through seventh active patterns ACT1 through ACT7 are disposed in the same layer and may be formed by the same process.

The scan lines Si−1, Si, and Si+1, the emission control lines Ei and Ei+1, and the lower electrode LE of the storage capacitor Cst may be disposed on the gate insulating layer GI formed on the first through seventh active patterns ACT1 through ACT7.

The initializing power line IPL and the upper electrode UE of the storage capacitor Cst may be disposed on the first interlayer insulating layer IL1 formed on the scan lines Si−1, Si, and Si+1, the emission control lines Ei and Ei+1, and the lower electrode LE of the storage capacitor Cst.

The data lines Dj, Dj+1, Dj+2, Dj+3, and Dj+4, the first conductive layer PL1 of the power line PL, the auxiliary connection line AUX, the connection line CNL, and the first bridge pattern BRP1 may be disposed on the second interlayer insulating layer IL2 formed on the initializing power line IPL and the upper electrode UE of the storage capacitor Cst.

The second bridge pattern BRP2 and the second conductive layer PL2 may be disposed on the third interlayer insulating layer IL3 formed on the data line Dj, the power line PL, the auxiliary connection line AUX, the connection line CNL, and the first bridge pattern BRP1.

The second conductive layer PL2 may be connected to the first conductive layer PL1 through the $11^{th}$ contact hole CH11 that passes through the third insulating layer IL3.

The second conductive layer PL2 may include the plurality of first conductive lines CL1 that extend in one direction and the plurality of second conductive lines CL2 that extend in a direction that intersects the first conductive lines CL1.

The first conductive lines CL1 and the second conductive lines CL2 may extend in a direction oblique to the data lines Dj, Dj+1, Dj+2, Dj+3, and Dj+4 and the scan lines Si−1, Si, and Si+1. The first conductive lines CL1 and the second conductive lines CL2 intersect each other and may form a plurality of regions.

The OLEDs "OLED" may be respectively arranged in the regions formed by intersecting the first conductive lines CL1 and the second conductive lines CL2. At least some of the OLEDs "OLED" may overlap at least one of the first conductive lines CL1 and the second conductive lines CL2.

For example, most of the OLEDs "OLED" do not overlap the first conductive lines CL1 and the second conductive lines CL2. However, some of the OLEDs "OLED" may overlap at least one of the first conductive lines CL1 and the second conductive lines CL2. For example, some of edges of the partial OLEDs "OLED" may overlap at least one of the first conductive lines CL1 and the second conductive lines CL2.

An area in which some of the edges of the OLEDs "OLED" overlap the first conductive lines CL1 and the second conductive lines CL2 may be smaller than an overlap area in a case in which the first conductive lines CL1 and the second conductive lines CL2 pass by the OLEDs "OLED". Therefore, the step differences under the OLEDs "OLED" may be reduced by the power line PL. When the step differences are reduced under the OLEDs "OLED", the concavo-convex parts of the surfaces from which the light components are emitted may be reduced in the OLEDs "OLED". When the concavo-convex parts of the surfaces from which the light components are emitted are reduced in the OLEDs "OLED", the light components generated by the OLEDs "OLED" may be uniformly emitted in accordance with a direction. Therefore, the color difference in accordance with the view angle of the display device including the OLEDs "OLED" may be reduced.

The OLEDs "OLED" may be disposed on the protective layer PSV formed on the second conductive layer PL2 and the second bridge pattern BRP2. Each of the OLEDs "OLED" may include the first electrode AD formed on the protective layer PSV, the emission layer EML formed on the first electrode AD, and the second electrode CD formed on the emission layer EML.

Some of the edges of the partial OLEDs "OLED" overlap at least one of the first conductive lines CL1 and the second conductive lines CL2 to prevent the first conductive lines CL1 and the second conductive lines CL2 from being arranged to be adjacent to the second bridge pattern BRP2. When the first conductive lines CL1 and the second conductive lines CL2 are arranged to be adjacent to the second bridge pattern BRP2, the first conductive lines CL1 and the second conductive lines CL2 may be shorted from the second bridge pattern BRP2.

FIG. 16 is a plan view illustrating a second power line, a second bridge pattern, and an OLED of a display device according to an exemplary embodiment of the present invention.

Referring to FIGS. 2 through 10 and 16, the first through seventh active patterns ACT1 through ACT7 may be disposed on the substrate SUB. The first through seventh active patterns ACT1 through ACT7 are disposed in the same layer and may be formed by the same process.

The scan lines Si−1, Si, and Si+1, the emission control lines Ei and Ei+1, and the lower electrode LE of the storage capacitor Cst may be disposed on the gate insulating layer GI formed on the first through seventh active patterns ACT1 through ACT7.

The initializing power line IPL and the upper electrode UE of the storage capacitor Cst may be disposed on the first interlayer insulating layer IL1 formed on the scan lines Si−1, Si, and Si+1, the emission control lines Ei and Ei+1, and the lower electrode LE of the storage capacitor Cst.

The data lines Dj, Dj+1, Dj+2, Dj+3, and Dj+4, the first conductive layer PL1 of the power line PL, the auxiliary connection line AUX, the connection line CNL, and the first bridge pattern BRP1 may be disposed on the second interlayer insulating layer IL2 formed on the initializing power line IPL and the upper electrode UE of the storage capacitor Cst.

The second bridge pattern BRP2 and the second conductive layer PL2 may be disposed on the third interlayer insulating layer IL3 formed on the data line Dj, the power line PL, the auxiliary connection line AUX, the connection line CNL, and the first bridge pattern BRP1.

The second conductive layer PL2 may be connected to the first conductive layer PL1 through the $11^{th}$ contact hole CH11 that passes through the third insulating layer IL3.

The second conductive layer PL2 may include the plurality of first conductive lines CL1 that extend in one direction and the plurality of second conductive lines CL2 that extend in a direction that intersects the first conductive lines CL1.

The first conductive lines CL1 and the second conductive lines CL2 may extend in a direction oblique to the data lines Dj, Dj+1, Dj+2, Dj+3, and Dj+4 and the scan lines Si−1, Si, and Si+1. The first conductive lines CL1 and the second conductive lines CL2 intersect each other and may form a plurality of regions. The OLEDs "OLED" may be arranged in the regions formed by intersecting the first conductive lines CL1 and the second conductive lines CL2. For example, the first conductive lines CL1 and the second conductive lines CL2 do not overlap the OLEDs "OLED" and may be disposed in the region between the adjacent OLEDs "OLED".

One or more of the first conductive lines CL1 or the second conductive lines CL2 are removed so that at least two OLEDs "OLED" may be arranged in the regions formed by intersecting the first conductive lines CL1 and the second conductive lines CL2.

The OLEDs "OLED" may be disposed on the protective layer PSV formed on the second conductive layer PL2 and the second bridge pattern BRP2. Each of the OLEDs "OLED" may include the first electrode AD formed on the protective layer PSV, the emission layer EML formed on the first electrode AD, and the second electrode CD formed on the emission layer EML.

Example embodiments of the present invention have been described herein, and it will be understood by those of skill in the art that various changes in form and details may be made without departing from the spirit and scope of the present invention.

What is claimed is:

1. A display device comprising:
pixels on a substrate, the pixels including at least a first transistor, a second transistor, a third transistor, and a fourth transistor, the first transistor including a gate electrode, a storage capacitor including a first electrode and a second electrode, and a light emitting element including an anode electrically connected to the first transistor;
a power line configured to supply power to the light emitting element; and
a connection line electrically connected to the first electrode,
wherein the second electrode forms an opening overlapped with the first electrode in a plan view, and
wherein the connection line electrically connects the gate electrode of the first transistor to a second transistor electrode of the third transistor and a second transistor electrode of the fourth transistor though a contact hole formed in the opening.

2. The display device of claim 1, wherein the second electrode covers an edge of the first electrode in the plan view.

3. The display device of claim 1, wherein the second transistor electrode of the third transistor and the second transistor electrode of the fourth transistor are disposed on a same layer, and
wherein the second transistor electrode of the third transistor and the second transistor electrode of the fourth transistor are disposed on a layer different from a layer on which the connection line is disposed.

4. The display device of claim 1, wherein the gate electrode of the first transistor and the second electrode face each other without another conductive layer interposed therebetween.

5. The display device of claim 1, wherein the first transistor includes a second transistor electrode, and the second transistor includes a second transistor electrode, and
wherein the second transistor electrode of the first transistor and the second transistor electrode of the second transistor are electrically connected to each other.

6. The display device of claim 1, wherein the first transistor includes a first transistor electrode, and the third transistor includes a first transistor electrode, and
wherein the first transistor electrode of the first transistor and the first transistor electrode of the third transistor are electrically connected to each other.

7. The display device of claim 1, wherein an edge of the first electrode is entirely covered by the second electrode in the plan view.

8. The display device of claim 1, further comprising a data line,
wherein the power line includes a first power line and a second power line disposed on different layers, and
wherein the first power line, the data line, and the connection line are disposed on a same layer.

9. A display device comprising:
pixels on a substrate, the pixels including at least one transistor, a storage capacitor including a first electrode and a second electrode, and a light emitting element including an anode electrically connected to the at least one transistor,
a power line configured to supply power to the light emitting element;
a connection line electrically connected to the first electrode; and
an insulating layer on the second electrode,
wherein the second electrode forms an opening overlapped with the first electrode in a plan view,
wherein the power line includes a first conductive layer and a second conductive layer on different layers each other on the insulating layer, and
wherein the connection line is disposed on a same layer as the first conductive layer.

10. A display device comprising:
pixels on a substrate, the pixels including at least one transistor, a storage capacitor including a first electrode and a second electrode, and a light emitting element including an anode electrically connected to the at least one transistor;
a power line configured to supply power to the light emitting element;
a data line electrically connected to at least one of the pixels; and
a connection line electrically connected to the first electrode,
wherein the second electrode forms an opening overlapped with the first electrode in a plan view, and
wherein the connection line is disposed on a same layer as the data line.

* * * * *